(12) United States Patent
Kulkarni et al.

(10) Patent No.: US 11,757,469 B2
(45) Date of Patent: Sep. 12, 2023

(54) COMPRESSION TECHNIQUE FOR DEEP NEURAL NETWORK WEIGHTS

(71) Applicant: QUALCOMM Incorporated, San Diego, CA (US)

(72) Inventors: Prajakt Kulkarni, San Diego, CA (US); Lakshmi Narayana Macha, San Diego, CA (US); Haoping Xu, North York (CA)

(73) Assignee: QUALCOMM Incorporated, San Diego, CA (US)

( * ) Notice: Subject to any disclaimer, the term of this patent is extended or adjusted under 35 U.S.C. 154(b) by 406 days.

(21) Appl. No.: 17/220,620

(22) Filed: Apr. 1, 2021

(65) Prior Publication Data

US 2022/0321143 A1    Oct. 6, 2022

(51) Int. Cl.
*H03M 7/30* (2006.01)
*G06N 3/04* (2023.01)

(52) U.S. Cl.
CPC ............. *H03M 7/702* (2013.01); *G06N 3/04* (2013.01)

(58) Field of Classification Search
CPC .......... H03M 7/46; H03M 7/702; G06N 3/04; G06N 3/063
See application file for complete search history.

(56) References Cited

U.S. PATENT DOCUMENTS

| | | | | |
|---|---|---|---|---|
| 8,406,256 B2 * | 3/2013 | Lee | ................... | H03M 13/2945 370/476 |
| 2009/0228764 A1 * | 9/2009 | Lee | ................... | H03M 13/27 714/776 |
| 2011/0093759 A1 * | 4/2011 | Song | ................... | H03M 13/13 714/756 |
| 2013/0035940 A1 * | 2/2013 | Wan | ................... | G06V 40/16 704/258 |
| 2019/0042251 A1 * | 2/2019 | Nurvitadhi | ........... | G05B 19/056 |

(Continued)

OTHER PUBLICATIONS

Delbru R., et al., "Searching web data: An entity retrieval and high-performance indexing model", Web Semantics: Science, Services and Agents on the World Wide Web, vol. 10, May 13, 2011, pp. 33-58, XP055093888, ISSN: 1570-8268, DOI: 10.1016/j.websem.2011.04.004 pp. 44-48, Sections 5-5.2.3.

(Continued)

*Primary Examiner* — Lam T Mai
(74) *Attorney, Agent, or Firm* — The Marbury Law Group, PLLC

(57) ABSTRACT

Various embodiments include methods and devices for compression and decompression of weight data sets. Some embodiments may include compressing weight data by receiving a weight data set of binary numbers representing weight values, generating a frame payload including a compressed first frame of a first subset of the weight values in the weight data set, and generating a block of compressed weight data having the frame payload. Some embodiments may include decompressing weight data by retrieving a block of compressed weight data, in which the block of compressed weight data includes a frame header associated with a frame payload, in which the frame header includes a normalization factor indicator, and in which the frame payload includes compressed weight values, and generating a first decompressed frame comprising decompressed weight values of the compressed weight values of the frame payload.

30 Claims, 16 Drawing Sheets

(56) References Cited

U.S. PATENT DOCUMENTS

| | | | |
|---|---|---|---|
| 2019/0348997 A1 | 11/2019 | Lee et al. | |
| 2021/0201134 A1* | 7/2021 | Li | G06N 3/08 |
| 2022/0069206 A1* | 3/2022 | Cheng | H10N 70/245 |
| 2022/0114454 A1* | 4/2022 | Park | G11C 19/00 |

OTHER PUBLICATIONS

International Search Report and Written Opinion—PCT/US2022/022497—ISA/EPO—dated Jul. 19, 2022.

\* cited by examiner

300

| | | |
|---:|:---:|:---|
| -13 | : | 1111111111110011 — 302a |
| -33 | : | 1111111110111111 |
| -3 | : | 1111111111111101 |
| 2 | : | 0000000000000010 |
| -2 | : | 1111111111111110 |
| 4 | : | 0000000000000100 |
| 1 | : | 0000000000000001 — 302b |
| 0 | : | 0000000000000000 |
| -2 | : | 1111111111111110 |
| 9 | : | 0000000000001001 |
| 10 | : | 0000000000001010 |
| -153 | : | 1111111101100111 — 302c |
| 0 | : | 0000000000000000 |
| 1 | : | 0000000000000001 — 302d |
| 0 | : | 0000000000000000 |
| 33 | : | 0000000000100001 |
| 2 | : | 0000000000000010 |
| -26 | : | 1111111111100110 |
| 0 | : | 0000000000000000 |
| 0 | : | 0000000000000000 — 302e |
| 0 | : | 0000000000000000 |
| -9 | : | 1111111111110111 |
| -81 | : | 1111111110101111 |
| 0 | : | 0000000000000000 |
| -3 | : | 1111111111111101 |
| -12 | : | 1111111111110100 |
| 1 | : | 0000000000000001 |
| -125 | : | 1111111110000011 |
| -1 | : | 1111111111111111 |
| 5 | : | 0000000000000101 |
| 0 | : | 0000000000000000 |
| -154 | : | 1111111101100110 |
| 4 | : | 0000000000000100 |

| | | |
|---:|:---:|:---|
| -13 | : | 111111111110011 |
| -33 | : | 111111111011111 |
| -3 | : | 111111111111101 |
| 2 | : | 000000000000010 — 304a |
| -2 | : | 111111111111110 |
| 4 | : | 000000000000100 |
| 1 | : | 000000000000001 |
| 0 | : | 000000000000000 |
| -2 | : | 111111111111110 |
| 9 | : | 000000000001001 |
| 10 | : | 000000000001010 |
| -153 | : | 111111101100111 — 304b |
| 0 | : | 000000000000000 |
| 1 | : | 000000000000001 |
| 0 | : | 000000000000000 |
| 33 | : | 000000000100001 |
| 2 | : | 000000000000010 |
| -26 | : | 111111111100110 |
| 0 | : | 000000000000000 |
| 0 | : | 000000000000000 — 304c |
| 0 | : | 000000000000000 |
| -9 | : | 111111111110111 |
| -81 | : | 111111110101111 |
| 0 | : | 000000000000000 |
| -3 | : | 111111111111101 |
| -12 | : | 111111111110100 |
| 1 | : | 000000000000001 |
| -125 | : | 111111110000011 — 304d |
| -1 | : | 111111111111111 |
| 5 | : | 000000000000101 |
| 0 | : | 000000000000000 |
| -154 | : | 111111101100110 |
| 4 | : | 000000000000100 |

FIG. 3B

COMPRESSION TECHNIQUE FOR DEEP NEURAL NETWORK WEIGHTS

BACKGROUND

In deep neural network processing, a quantized neural network model can contain a large amount of weights. The large amount of weights requires a large amount of memory, system bandwidth, and electric power when the weights are used by a processor/hardware to implement deep neural network processing.

SUMMARY

Various disclosed aspects may include apparatuses and methods for compression of weight data for neural networks. Various aspects may include receiving a weight data set of binary numbers representing weight values, generating a first frame payload including a compressed first frame of a first subset of the weight values in the weight data set, generating a first frame header associated with the first frame payload, in which the first frame header includes a normalization factor indicator for the compressed first frame, and generating a block of compressed weight data having the first frame payload.

In some aspects, generating the first frame payload may include compressing a first frame of the first subset of the weight values in the weight data set by removing padding bits from each weight value of the first subset of the weight values according to a normalization factor for the first frame to generate the compressed first frame.

Some aspects may further include removing an offset value from each weight value of the first subset of the weight values of the first frame producing modified weight values of the first frame, in which compressing the first frame of the first subset of the weight values may include removing the padding bits from the modified weight values in the first frame according to the normalization factor for the compressed first frame to generate the first frame.

Some aspects may further include generating a global header for the block of compressed weight data, in which the global header includes the offset value, and in which generating the first frame header associated with the first frame payload may include generating the first frame header, in which the first frame header includes an offset indicator configured to indicate whether the offset value is removed from the first subset of the weight values of the first frame.

In some aspects, the padding bits may be sign extended bits.

Some aspects may further include identifying a first frame of the first subset of the weight values in the weight data set based on patterns of padding bits in the weight values that can be removed from the weight values for lossless compression based on selective search criteria, setting a first normalization factor for the first frame representing a number of padding bits to be removed from each weight value of the first subset of the weight values, identifying a second frame of a second subset of the weight values in the weight data set based on patterns of padding bits in the weight values that can be removed from the weight values for lossless compression based on selective search criteria, determining whether all bits of the second frame are zero value, and in response to determining that all of the bits of the second frame are zero value: setting a second normalization factor for the second frame to represent all of the bits of the second subset of the weight values of the second frame, compressing the second frame of the second subset of the weight values by removing all of the bits from the second subset of the weight values according to the second normalization factor for the second frame, and generating a second frame header that is unassociated with a frame payload.

Some aspects may further include identifying a first frame of the first subset of the weight values in the weight data set based on patterns of padding bits in the weight values that can be removed from the weight values for lossless compression based on selective search criteria, identifying a weight value of the first subset of the weight values of the first frame having a highest number of significant bits, and setting the normalization factor for the first frame representing a number of padding bits to be removed from each weight value of the first subset of the weight values based on the highest number of significant bits.

Some aspects may further include determining whether a first compression metric of the first frame payload exceeds a compression metric threshold, in which generating the block of compressed weight data having the first frame payload may include generating the block of compressed weight data having the first frame payload in response to determining that the first compression metric of the first frame payload exceeds the compression metric threshold.

Some aspects may further include setting the compression metric threshold to the first compression metric of the first frame payload, generating a second frame payload including a compressed second frame of a second subset of the weight values in the weight data set, determining whether a second compression metric of the second frame payload exceeds the compression metric threshold, setting the compression metric threshold to the second compression metric of the second frame payload in response to determining that the second compression metric exceeds the compression metric threshold, generating a third frame payload including a compressed third frame of a third subset of the weight values in the weight data set, and determining whether a third compression metric of the third frame payload exceeds the compression metric threshold, in which generating the block of compressed weight data having the first frame payload in response to determining that the first compression metric of the first frame payload exceeds the compression metric threshold may include generating the block of compressed weight data having the second frame payload in response to determining that the third compression metric of the third frame payload does not exceed the compression metric threshold.

Various aspects may include apparatuses and methods for decompression of weight data for neural networks. Various aspects may include retrieving a block of compressed weight data, in which the block of compressed weight data includes a first frame header associated with a first frame payload, in which the first frame header includes a first normalization factor indicator, and in which the first frame payload includes compressed weight values; and generating a first decompressed frame comprising decompressed weight values of the compressed weight values of the first frame payload.

In some aspects, the block of compressed weight data includes a global header having an offset value, and the first frame header includes an offset indicator configured to indicate whether the offset value is to be included for each decompressed weight value generated from the first frame payload. Some aspects may further include parsing the global header for the offset value, parsing the first frame header for the offset indicator, and determining whether the offset indicator is set in the first frame header, in which generating the first decompressed frame may include including the offset value in each decompressed weight value generated from the first frame payload associated with the first frame header in response to determining that the offset indicator is set in the first frame header.

In some aspects, the block of compressed weight data includes a second frame header unassociated with a frame payload including a second normalization factor indicator. Some aspects may further include generating a second decompressed frame including decompressed weight values having all zero value bits according to the second normalization factor indicator of the second frame header.

In some aspects, the block of compressed weight data includes a second frame header associated with a second frame payload, in which the second frame header includes a second normalization factor indicator, and in which the second frame payload includes compressed weight values. Some aspects further include generating a second decompressed frame including decompressed weight values of the compressed weight values of the second frame payload by adding padding bits to the compressed weight values of the second frame payload according to the second normalization factor indicator of the second frame header.

In some aspects, generating the first decompressed frame may include adding padding bits to the compressed weight values of the first frame payload according to the first normalization factor indicator of the first frame header to generate decompressed weight values, in which a value of the padding bits for a first compressed weight value of the compressed weight values of the first frame payload is determined from a most significant bit of the first compressed weight value.

In some aspects, the padding bits may be sign extended bits.

In some aspects the first frame header includes a frame length configured to indicate a number of the compressed weight values of the first frame payload.

In some aspects the block of compressed weight data includes a second frame header unassociated with a frame payload including a frame length configured to indicate a second decompressed frame including a number of the compressed weight values. Some aspects may further include generating a number consecutive decompressed weight values having all zero value bits corresponding to the frame length of the second frame header.

Further aspects include a computing device having a compression processing device or a decompression processing device configured to perform operations of any of the methods summarized above.

BRIEF DESCRIPTION OF THE DRAWINGS

The accompanying drawings, which are incorporated herein and constitute part of this specification, illustrate example embodiments of various embodiments, and together with the general description given above and the detailed description given below, serve to explain the features of the claims.

FIGS. 3A and 3B are data diagrams illustrating examples of framing of binary representations of decimal weight values for compression suitable for implementing various embodiments.

DETAILED DESCRIPTION

Figure 1:
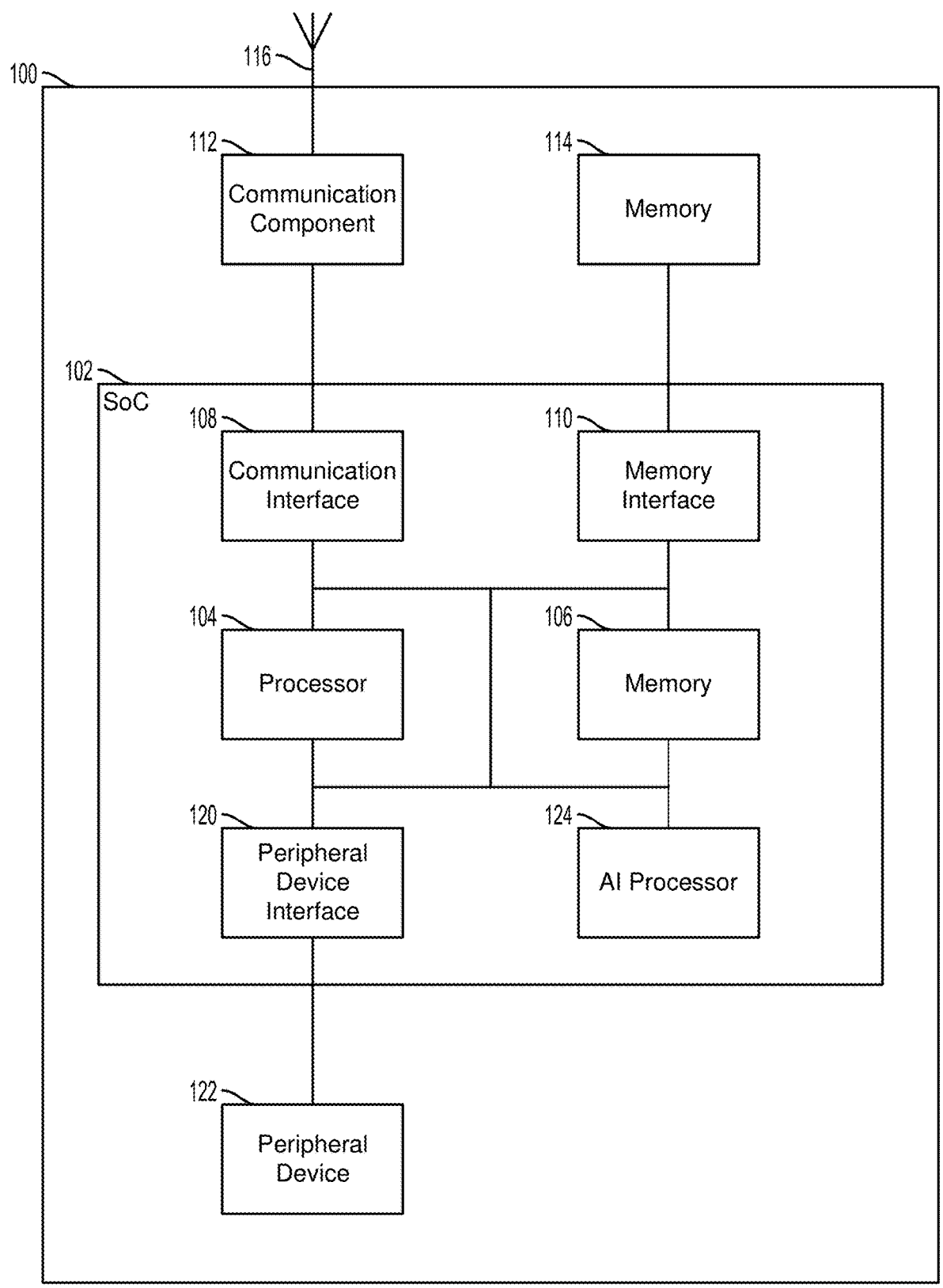
FIG. 1 is a component block diagram illustrating an example computing device suitable for implementing various embodiments.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Various embodiments include methods and computing devices implementing such methods for compression and decompression of weight data for deep neural networks. Some embodiments may include a lossless compression technique for weight data for deep neural networks. In some embodiments, the compression may be based on identification of frames of weight data that exhibit patterns of repetitive data and removal of the repetitive data for the compression. In some embodiments, global and/or frame header information relating to how the weight data is compressed may provide information for decompression of the compressed weight data.

Deep neural network processing often requires large amounts of data. This data can include a large amount of weight data that burdens a computer system with high memory, system bandwidth, and electric power costs by a processor/hardware used to implement deep neural network processing. The embodiments described herein present methods and devices for implementing the methods of lossless weight data compression and very low cost decompression, which may reduce the memory, system bandwidth, and electric power costs of implementing deep neural network processing using large amount of weight data.

In some embodiments, the compression of the weight data may be done offline and compressed weight data may be stored in a memory for implementing deep neural network processing. Offline compression of the weight data may allow for costly and time consuming searching for adequate compression of the weight data as measured by a compression metric of compressed weight data compared to a compression metric threshold. In some embodiments, the compression metric threshold may be configured to identify a best compression of the weight data within parameters for searching for combinations subsets of the weight data for compression. In some embodiments, sparsity in the weight data, for which contiguous weight values are zero values may be compressed in a manner so that none of the weight data may be stored for the contiguous zero values.

Not all of the weight data, such as padding data in the weigh values, may be useful in implementing deep neural network processing. In some embodiments, the compression of the weight data may be implemented by identifying frames of weight data exhibiting patterns of padding data that may be removed from the weight data without altering the weight values of the frames. Removing the padding data may reduce the amount of data of the frame and of the broader set of weight data. Compression parameters, such as a normalization factor configured to indicate an amount of padding data removed from each weight value in a frame, may be stored in association with the compressed weight data for use in decompressing the compressed weight data. The removal of padding data from a frame for compression of the weight data of the frame may be accomplished by shifting the remaining bits of the weight data to overwrite the padding data being removed. A number of bits of a weight data remaining following removal of the padding bits may be referred to herein as a compressed weight bit-width.

In some embodiments, low cost decompression may be accomplished by using bitwise operations to denormalize the compressed weight data. The normalization factor may indicate to a decompression computing device the number of bits to shift each of the compressed weight values to reintroduce the padding bits to the compressed weight data. In some embodiments, bitwise arithmetic operations may be used to generate the corresponding value for the reintroduced padding data as compared to the original padding data of the weight values. In some embodiments, the padding bits may be sign extended bits.

The terms "computing device" and "mobile computing device" are used interchangeably herein to refer to any one or all of cellular telephones, smartphones, personal or mobile multi-media players, personal data assistants (PDA's), laptop computers, tablet computers, convertible laptops/tablets (2-in-1 computers), smartbooks, ultrabooks, netbooks, palm-top computers, wireless electronic mail receivers, multimedia Internet enabled cellular telephones, mobile gaming consoles, wireless gaming controllers, and similar personal electronic devices that include a memory, and a programmable processor. The term "computing device" may further refer to stationary computing devices including personal computers, desktop computers, all-in-one computers, workstations, super computers, mainframe computers, embedded computers (such as in vehicles and other larger systems), servers, multimedia computers, and game consoles.

FIG. 1 illustrates a system including a computing device 100 suitable for use with various embodiments. The computing device 100 may include an SoC 102 with a processor 104, a memory 106, a communication interface 108, a memory interface 110, a peripheral device interface 120, and artificial intelligence (AI) processor 124. The computing device 100 may further include a communication component 112, such as a wired or wireless modem, a memory 114, an antenna 116 for establishing a wireless communication link, and/or a peripheral device 122. The processor 104 and the AI processor 124 may include any of a variety of processing devices, for example a number of processor cores.

The term "system-on-chip" or "SoC" is used herein to refer to a set of interconnected electronic circuits typically, but not exclusively, including a processing device, a memory, and a communication interface. A processing device may include a variety of different types of processors 104 and/or processor cores, such as a general purpose processor, a central processing unit (CPU), a digital signal processor (DSP), a graphics processing unit (GPU), an accelerated processing unit (APU), a secure processing unit (SPU), a subsystem processor of specific components of the computing device, such as an image processor for a camera subsystem or a display processor for a display, an auxiliary processor, a single-core processor, a multicore processor, a controller, and/or a microcontroller. A processing device may further embody other hardware and hardware combinations, such as a field programmable gate array (FPGA), an application-specific integrated circuit (ASIC), other programmable logic device, discrete gate logic, transistor logic, performance monitoring hardware, watchdog hardware, and/or time references. Integrated circuits may be configured such that the components of the integrated circuit reside on a single piece of semiconductor material, such as silicon.

An SoC 102 may include one or more processors 104. The computing device 100 may include more than one SoC 102, thereby increasing the number of processors 104 and processor cores. The computing device 100 may also include processors 104 that are not associated with an SoC 102. Individual processors 104 may be multicore processors. The processors 104 may each be configured for specific purposes that may be the same as or different from other processors 104 of the computing device 100. One or more of the processors 104 and processor cores of the same or different configurations may be grouped together. A group of processors 104 or processor cores may be referred to as a multiprocessor cluster.

The memory 106 of the SoC 102 may be a volatile or non-volatile memory configured for storing data and processor-executable code for access by the processor 104 or by other components of SoC 102, including an AI processor 124. The computing device 100 and/or SoC 102 may include one or more memories 106 configured for various purposes. One or more memories 106 may include volatile memories such as random access memory (RAM) or main memory, or cache memory. These memories 106 may be configured to temporarily hold a limited amount of data received from a data sensor or subsystem, data and/or processor-executable code instructions that are requested from non-volatile memory, loaded to the memories 106 from non-volatile memory in anticipation of future access based on a variety of factors, and/or intermediary processing data and/or processor-executable code instructions produced by the processor 104 and/or AI processor 124 and temporarily stored for future quick access without being stored in non-volatile memory. In some embodiments, any number and combination of memories 106 may include one-time programmable or read-only memory.

The memory 106 may be configured to store data and processor-executable code, at least temporarily, that is loaded to the memory 106 from another memory device, such as another memory 106 or memory 114, for access by one or more of the processors 104 or by other components of SoC 102, including the AI processor 124. The data or processor-executable code loaded to the memory 106 may be loaded in response to execution of a function by the processor 104 or by other components of SoC 102, including the AI processor 124. Loading the data or processor-executable code to the memory 106 in response to execution of a function may result from a memory access request to the memory 106 that is unsuccessful, or a "miss," because the requested data or processor-executable code is not located in the memory 106. In response to a miss, a memory access request to another memory 106 or memory 114 may be made to load the requested data or processor-executable code from the other memory 106 or memory 114 to the memory 106. Loading the data or processor-executable code to the memory 106 in response to execution of a function may result from a memory access request to another memory 106 or memory 114, and the data or processor-executable code may be loaded to the memory 106 for later access.

The memory interface 110 and the memory 114 may work in unison to allow the computing device 100 to store data and processor-executable code on a volatile and/or non-volatile storage medium, and retrieve data and processor-executable code from the volatile and/or non-volatile storage medium. The memory 114 may be configured much like an embodiment of the memory 106 in which the memory 114 may store the data or processor-executable code for access by one or more of the processors 104 or by other components of SoC 102, including the AI processor 124. In some embodiments, the memory 114, being non-volatile, may retain the information after the power of the computing device 100 has been shut off. When the power is turned back on and the computing device 100 reboots, the information stored on the memory 114 may be available to the computing device 100. In some embodiments, the memory 114, being volatile, may not retain the information after the power of the computing device 100 has been shut off. The memory interface 110 may control access to the memory 114 and allow the processor 104 or other components of the SoC 12, including the AI processor 124, to read data from and write data to the memory 114.

An SoC 102 may also include an AI processor 124. The AI processor 124 may be a processor 104, a portion of a processor 104, and/or a standalone component of the SoC 102. The AI processor 124 may be configured to execute neural networks for processing activation values and weight values on the computing device 100. The computing device 100 may also include AI processors 124 that are not associated with the SoC 102. Such AI processors 124 may be standalone components of the computing device 100 and/or integrated into other SoCs 102.

Some or all of the components of the computing device 100 and/or the SoC 102 may be arranged differently and/or combined while still serving the functions of the various embodiments. The computing device 100 may not be limited to one of each of the components, and multiple instances of each component may be included in various configurations of the computing device 100.

Figure 2:
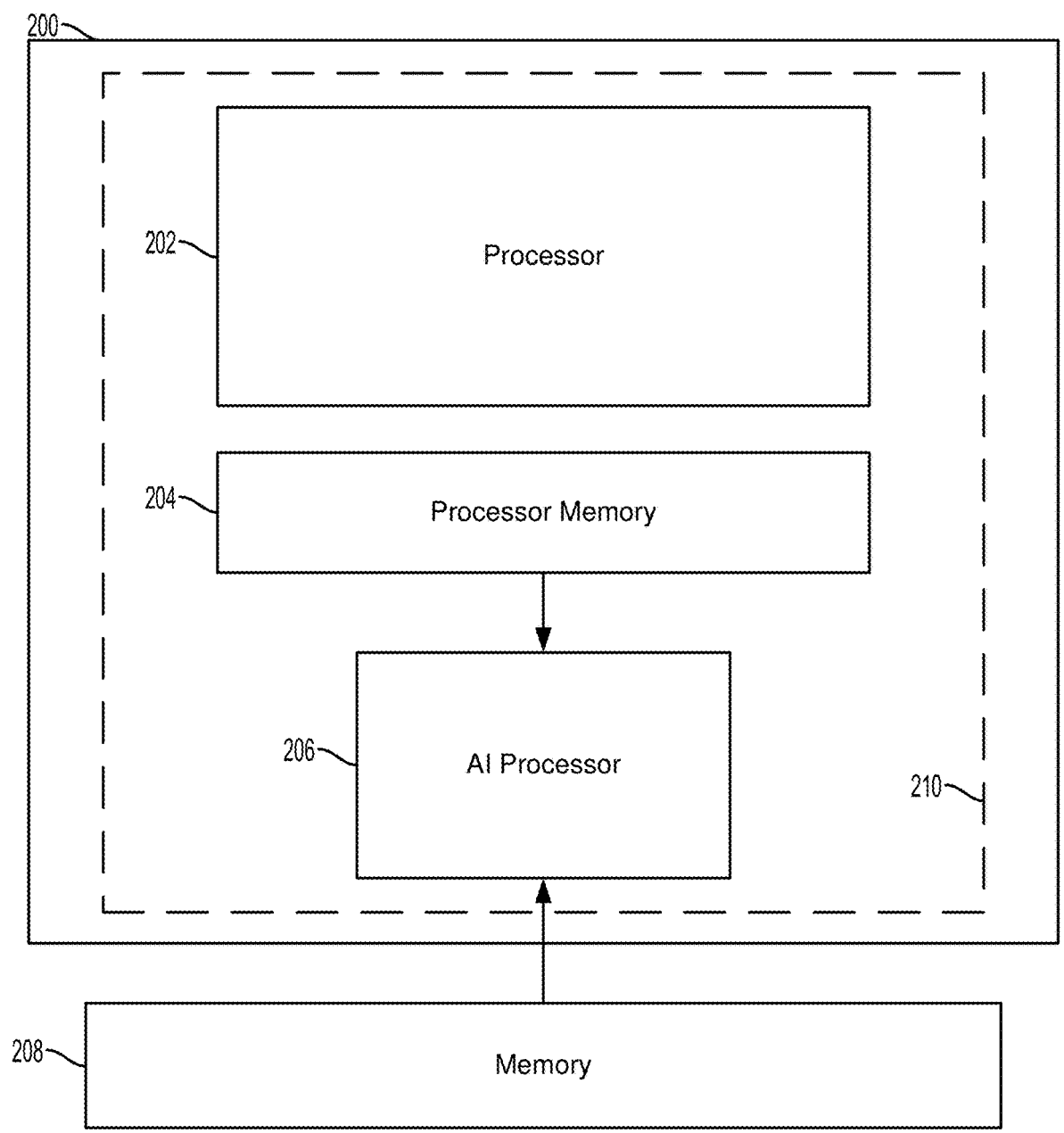
FIG. 2 is a component block diagram illustrating an example system on chip (SoC) suitable for implementing various embodiments.

FIG. 2 illustrates an SoC 200 (e.g., SoC 102 in FIG. 1), which may be a component of a computing device (e.g., computing device 100 in FIG. 1) with an AI processor 206 (e.g., AI processor 124 in FIG. 1) and other components suitable for implementing an embodiment. With reference to FIGS. 1 and 2, the SoC 200 may include a variety of components as described above. For example, the SoC 200 may include the AI processor 206, a processor 202 (e.g., processor 104 in FIG. 1), and a processor memory (e.g., memory 106 in FIG. 1). In some embodiments, some such components, such as the components described as part of SoC 200, may be located within a low power area 210 of the SoC 200.

A block of compressed frames of a weight data set may be stored at a memory 208 (e.g., memory 114 in FIG. 1) off of the SoC 200 and/or the processor memory 204 on the SoC 200. In some embodiments, the block of compressed frames of the weight data set may be loaded to the processor memory 204 from the memory 208.

The AI processor 206 may be configured to implement neural network processes, such as generating inferences, using activation and weight values. The AI processor 206 may retrieve weight values for the neural network processes from the block of compressed frames of the weight data set. In some embodiments, the AI processor 206 may receive the block of compressed frames of the weight data set from the memory 208. In some embodiments, the AI processor 206 may receive the block of compressed frames of the weight data set from the processor memory 204.

The AI processor 206 may be configured to decompress the block of compressed frames of the weight data set to retrieve the weight values. In some embodiments, the AI processor 206 may be configured with software for decompressing the block of compressed frames of the weight data set. In some embodiments, the AI processor 206 may be configured with circuitry and/or configured with software for decompressing the block of compressed frames of the weight data set. Decompressing the block of compressed frames of the weight data set is described further herein.

The weight values resulting from the decompression of the block of compressed frames of the weight data set may be used by the AI processor 206 to implement neural network processes. In some embodiments, the AI processor 206 may use a combination of the weight values retrieved from the block of compressed frames of the weight data set by decompression and weight values of the weight data set that were not compressed. In some embodiments, the results of the neural network processes implemented by the AI processor 206 may be stored to the memory 204 and/or the memory 208. In some embodiments, the results of the neural network processes implemented by the AI processor 206 may retrieved from the AI processor 206, the memory 204, and/or the memory 208 for processing by the processor 202.

The descriptions herein of the SoC 200 and its various components illustrated in FIG. 2 are only meant to be examples and in no way limiting. Several of the components of the illustrated example SoC 200 may be variably configured, combined, and separated. Several of the components may be included in greater or fewer numbers and may be located and connected differently within the SoC 200 or separate from the SoC 200. Similarly, numerous other components, such as other memories, processors, peripheral device subsystems, interfaces, and controllers, may be included in the SoC 200.

FIGS. 3A and 3B illustrate examples of framing of binary representations of decimal weight values for compression suitable for implementing embodiments. With reference to FIGS. 1-3B, a weight data set 300 may include representations of weight values. The examples of the weight data set 300 in FIGS. 3A and 3B include decimal and signed binary representations of integer weight values (shown in FIGS. 3A and 3B for clarity).

For compression of weight values from the weight data set 300, analysis of the weight data set 300 may be conducted to determine portions of the weight data set 300 which may be grouped into frames 302a, 302b, 302c, 302d, 302e, 304a, 304b, 304c, 304d. A computing device (e.g., computing device 100) may have a processor (e.g., processor 104, AI processor 124 in FIG. 1, processor 202, AI processor 206 in FIG. 2) configured to analyze the weight data set 300, identify various frames, including frames 302a, 302b, 302c, 302d, 302e, 304a. 304b, 304c, 304d and/or other frames not shown, and select various combinations of frames for determining which frames to use for compressing the weight data set 300. The analysis of the weight data set 300 may select a combination of frames for which a compression metric meets and/or exceeds a compression metric threshold. The compression metric and/or compression metric threshold may be based on a compression ratio, compression size, etc.

In some embodiments the compression metric threshold may be a predetermined value. A combination of frames that meets and/or exceeds the compression metric threshold may be used for compressing the weight data set 300. In some embodiments the compression metric threshold may be set to a best compression metric from the analysis of the compressed weight data set 300. For example, the compression metric of a first combination of frames may be set as the compression metric threshold, and the compression metric of any successive combination of frames exceeding the compression metric threshold may be set as the compression metric threshold. Once no combination of frames can exceed the compression metric threshold, the compression metric threshold may be the best compression metric. The combination of frames associated with the best compression metric may be the combination of frames to be used for compressing the weight data set 300.

In some embodiments, the identification of frames and/or the selection of frames may be implemented by a search algorithm. In some embodiments, the search algorithm may be configured to identify every frame and/or select every combination of frames. In some embodiments, the search algorithm may be an exhaustive search algorithm. In some embodiments, the search algorithm may be configured to identify frames and/or select combinations of frames based on selective search criteria that may limit the number of frames and/or the number of combinations of frames. In some embodiments, the search algorithm may be configured to identify frames and/or select combinations of frames based on selective search criteria that may prioritize certain frames and/or certain combinations of frames. For example, the selective search criteria may include a frame length (such as number of weight values in a frame), a range of frame lengths, a normalization factor (such a number of bits of weight values in a frame that may be removed without loss), a range of normalization factors, a weight value, a range of weight values, an offset value (such as a value by which weight values of a frame may be altered), a range of offset values, etc.

A neural network may use weights quantized to a certain size. For example, a neural network may use weights quantized to 4-bits, 8-bits, 16 bits, etc. However, not all weight values may use the full quantization size. Therefore, a weight value may include bits that represent the weight value, referred to herein as significant bits, which may include a sign bit, and bits that are not necessary to represent the weight value, referred to herein as padding bits. In some embodiments, the padding bits may be repetitive bit values, such as bit values repeating the most significant bit and/or different from the most significant bit of a weight value. In some embodiments, the padding bits may be sign extended bits. Some or all of the padding bits may be removed from a weight value to compress the weight value without loss. The analysis of the weight data set 300 may identify patterns in contiguous weight values of padding bits that may be removed from the weight values without loss. For example, the patterns of padding bits that may be removed from the weight values without loss may be a shared number of some and/or all of the padding bits in contiguous weight values. The patterns of padding bits that may be removed from the weight values without loss in the contiguous weight values may be identified based on a number of contiguous weight values, which may be referred to as a frame length. The contiguous weight values exhibiting a pattern may be grouped as a frame 302a, 302b, 302c, 302d. 302e. 304a, 304b, 304c, 304d. In some embodiments, the identification of weight values exhibiting the patterns identify overlapping frames and selection of the frames may select non-overlapping frames. In some embodiments, the selected frames may be contiguous frames. In some embodiments, the selected frames may be non-contiguous frames.

In some embodiments, the processor may apply an offset to some and/or all of the weight values. In some embodiments, the processor may apply the offset to weight values of a frame. Applying the offset to the weight values may include modifying the weight values by the offset. For example, the offset may be removed from the weight values via subtraction from and/or addition to the weight values. Applying the offset to the weight values may generally reduce the number of bits in weight values that may be used to represent the weight values, the significant bits. Similarly, applying the offset to the weight values may generally increase the number of padding bits in the weight values. Weight values having the offset applied may be grouped into frames based on a pattern of padding bits that may be removed from the weight values without loss.

To compress a selected frame, the processor may remove the padding bits of the weight values in the selected frame according to the pattern of padding bits that may be removed from the weight values of the selected frame without loss. Each of the weight values in the selected frame may have some or all of their padding bits removed. The number of the padding bits removed from each weight value of the selected frame may be referred to herein as a normalization factor. The modification of the weight values may leave only the significant bits and/or the significant bits and less than all of the padding bits for the weight values in the selected frame. In some embodiments, the padding bits removed from each of the weight values in the selected frame may be based on the number of padding bits that may be removed from a weight value having the most significant bits in the selected frame. As such, the number of padding bits that may be removed from the weight value having the most significant bits may also be removed from the other weight values in the selected frame. Each selected frame may have its own normalization factor. In some embodiments removing the number of padding bits may involve shifting the remaining bits to overwrite the padding bits being removed. A number of bits of a weight value remaining following removal of the padding bits may be referred to herein as a compressed weight bit-width.

The example illustrated in FIG. 3A shows a selection of frames 302a, 302b, 302c, 302d, 302e having variable frame lengths. Frame 302a has a frame length configured to represent a group of two weight values (e.g., −13 and −33). Frame 302b has a frame length configured to represent a group of nine weight values (e.g., −3, 2, −2, 4, 1, 0, −2, 9, and 10). Frame 302c has a frame length configured to represent a group of one weight value (e.g., −153). Frame 302d has a frame length configured to represent a group of three weight values (e.g., 0, 1, and 0). Frame 302e has a frame length configured to represent a group of three weight values (e.g., 0, 0, and 0).

The example illustrated in FIG. 3A further shows the selection of frames 302a, 302b, 302c, 302d, 302e having variable normalization factors. Frame 302a has a normalization factor configured to represent removing eight padding bits from each of the weight values in frame 302a. Frame 302b has a normalization factor configured to represent removing eleven padding bits from each of the weight values in frame 302b. Frame 302c has a normalization factor configured to represent removing six padding bits from the weight value in frame 302c. Frame 302d has a normalization factor configured to represent removing fourteen padding bits from each of the weight values in frame 302d. In some embodiments, frame 302e has a normalization factor configured to represent removing fifteen padding bits from each of the weight values in frame 302e. In some embodiments, frame 302e has a normalization factor configured to represent removing all bits from each of the weight values in frame 302e. As discussed further herein, frames, such as frame 302e, having only weight values of zero may be represented in a compression block by a header without a frame payload, allowing all of the bits of the frame to be removed during compression.

The example illustrated in FIG. 3B shows a selection of frames 304a, 304b, 304c, 304d having uniform frame lengths. In this example, the uniform frame length is eight weight values. However, the uniform frame length may be any number of weight values. In some embodiments, the uniform frame length may be an exponential value of two number of weight values (e.g., 2, 4, 8, 16, 32, 64, 128, etc.). Frame 304a has a frame length configured to represent a group of eight weight values (e.g., −13, −33, −3, 2, −2, 4, 1, and 0). Frame 304b has a frame length configured to represent a group of eight weight values (e.g., −2, 9, 10, −153, 0, 1, 0 and 33). Frame 304c has a frame length configured to represent a group of eight weight values (e.g., 2, −26, 0, 0, 0, −9, −81, and 0). Frame 304d has a frame length configured to represent a group of eight weight values (e.g., −3, −12, 1, −125, −1, 5, 0, and −154).

The example illustrated in FIG. 3B further shows the selection of frames 304a, 304b, 304c, 304d having variable normalization factors. Frame 304a has a normalization factor configured to represent removing eight padding bits from each of the weight values in frame 304a. Frame 304b has a normalization factor configured to represent removing six padding bits from each of the weight values in frame 304b. Frame 304c has a normalization factor configured to represent removing seven padding bits from the weight value in frame 304c. Frame 304d has a normalization factor configured to represent removing six padding bits from each of the weight values in frame 304d.

The examples in FIGS. 3A and 3B are meant to be illustrative and do not limit the scope of the claims or the specification. The weight data set 300 may include any number of weight values and the weight values may be of any size and/or format. The processor of the computing device analyzing the weight data set 300 may identify and select frames of any number and/or length, and having any normalization factor.

Figure 4:
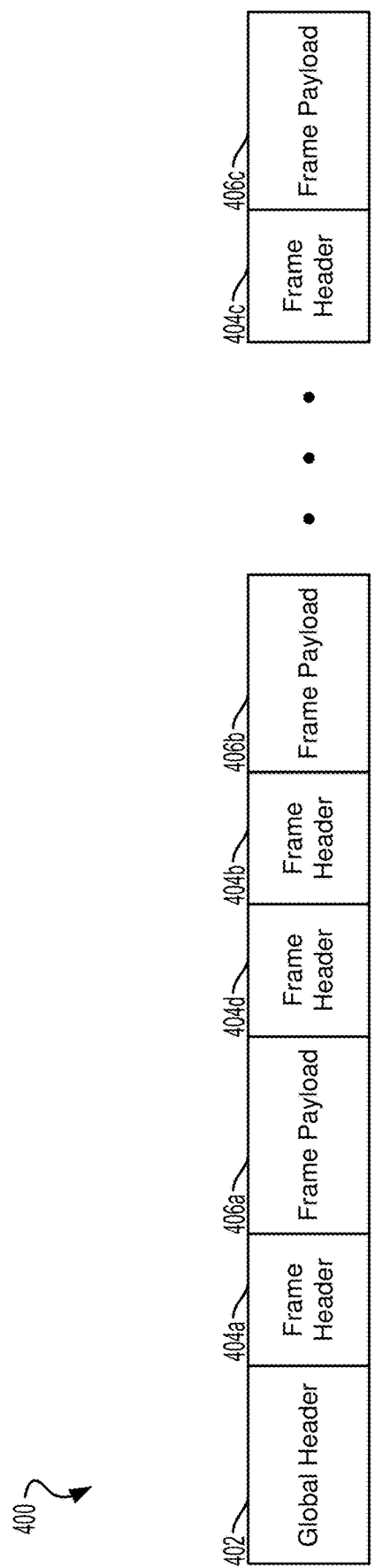
FIG. 4 is a block diagram illustrating an example of a block of compressed weight data suitable for implementing various embodiments.

FIG. 4 illustrates example of a block of compressed weight data suitable for implementing embodiments. With reference to FIGS. 1-4, block of compressed weight data 400 may include a global header 402, any number of frame headers 404a, 404b, 404c, 404d, and any number of frame payloads 406a, 406b, 406c. A compression computing device (e.g., computing device 100) may have a processor (e.g., processor 104, AI processor 124 in FIG. 1, processor 202, AI processor 206 in FIG. 2) configured to compress a weight data set (e.g., weight data set 300 in FIGS. 3A and 3B). The compression of the weight data set may generate the block of compressed weight data 400. A decompression computing device (e.g., computing device 100) may have a processor (e.g., processor 104, AI processor 124 in FIG. 1, processor 202, AI processor 206 in FIG. 2) configured to decompress the block of compressed weight data 400. The block of compressed weight data 400 may be stored at a memory (e.g., memory 106, 114 in FIG. 1, processor memory 204, memory 208 in FIG. 2) of the compression computing device and/or the decompression computing device.

As described further herein, the global header 402 may include parameters that may be applied for decompression of any combination and/or all of the frame payloads 406a, 406b, 406c. As described further herein, the frame headers 404a, 404b, 404c may include parameters that may be applied for decompression of an associated frame payload 406a, 406b, 406c, and the frame headers 404d may include parameters that may be applied for decompression without an associated frame payload. The frame payloads 406a, 406b, 406c may include the compressed weight values of an associated frame (e.g., frame 302a, 302b, 302c, 302d, 302e, 304a, 304b, 304c, 304d in FIGS. 3A and 3B). In some embodiments, the block of compressed weight data 400 may be ordered so that the associated frame headers 404a, 404b, 404c and frame payloads 406a, 406b, 406c are paired. In some embodiments, the block of compressed weight data 400 may be ordered so that the frame headers 404a, 404b, 404c, 404d and frame payloads 406a, 406b, 406c are ordered in an order of the frames in the weight data set.

Figure 5:
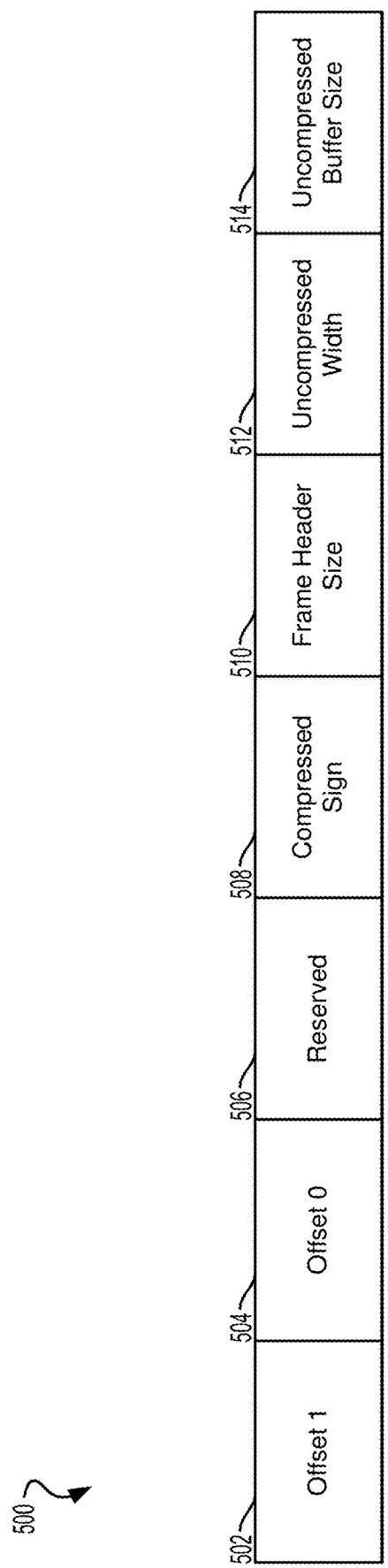
FIG. 5 is a block diagram illustrating an example of a global header of a block of compressed weight data suitable for implementing various embodiments.

FIG. 5 illustrates example of a global header of a block of compressed weight data (e.g., block of compressed weight data 400 in FIG. 4) suitable for implementing embodiments. With reference to FIGS. 1-5, a global header 500 (e.g., global header 402 in FIG. 4) may be of any size and include parameters that may be applied for decompression of any combination and/or all of frame payloads (e.g., frame payloads 406a, 406b, 406c in FIG. 4) of the compressed weight data. A compression computing device (e.g., computing device 100) may have a processor (e.g., processor 104, AI processor 124 in FIG. 1, processor 202, AI processor 206 in FIG. 2) configured to compress a weight data set (e.g., weight data set 300 in FIGS. 3A and 3B). The compression of the weight data set may generate the global header 500. A decompression computing device (e.g., computing device 100) may have a processor (e.g., processor 104, AI processor 124 in FIG. 1, processor 202, AI processor 206 in FIG. 2) configured to decompress the block of compressed weight data using the global header 500. The global header 500 may be stored at a memory (e.g., memory 106, 114 in FIG. 1, processor memory 204, memory 208 in FIG. 2) of the compression computing device and/or the decompression computing device. In some embodiments, the global header 500 may be any bit-width. For example, the global header 500 may be 9 bytes.

The global header 500 may include any number of offsets 502, 504. In some embodiments, an offset 502, 504 may be a value applied to the weight values of any number and/or combination of frames (e.g., frame 302*a*, 302*b*. 302*c*. 302*d*, 302*e*, 304*a*, 304*b*, 304*c*, 304*d* in FIGS. 3A and 3B) for compression of the weight data set. In some embodiments, a default value of an offset 502, 504 may be set to zero. The offset 502, 504 may be applied to the weight values for compression of the weight data set to modify the weight values by the offset. For example, the offset may be removed from the weight values via subtraction from and/or addition to the weight values. Applying the offset to the weight values may generally reduce the number of bits in weight values that may be used to represent the weight values, the significant bits. Similarly, applying the offset to the weight values may generally increase the number of padding bits in the weight values. The offset value may be used in decompression of the block of compressed weight data to return weight values modified by the offset during compression to the original weight values. For example, the offset may be added to the modified weight values via subtraction from and/or addition to the modified weight values. In some embodiments, the offset 502, 504 may be the same bit-width as the weight values. For example, the offset 502, 504 may have a bit-width of a number of bits that is an exponential value of two, such as 2 bits, 4 bits, 8 bits, 16 bits, 32 bits, 64 bits, 128 bits, etc.

In some embodiments, the global header 500 may include any number of reserved bits 506, which may be configured for providing a parameter for decompressing block of compressed weight data. In some embodiments, the number of reserved bits 506 may be 1 bit, 2 bits, etc.

In some embodiments, the global header 500 may include a compressed sign value 508 configured to represent whether the frame payloads of the block of compressed weight data contain signed compressed weight data. The compressed sign value 508 may be generated during compression of the weight data set. For example, the compressed sign value 508 may be configured to represent that the frame payloads of the block of compressed weight data contain signed compressed weight data when at least one weight value of the weight data set is a signed weight value. For another example, the compressed sign value 508 may be configured to represent that the frame payloads of the block of compressed weight data contain signed compressed weight data when at least one weight value of at least one frame of the weight data set is a signed weight value. For another example, the compressed sign value 508 may be configured to represent that the frame payloads of the block of compressed weight data do not contain signed compressed weight data when no weight value of the weight data set is a signed weight value. For another example, the compressed sign value 508 may be configured to represent that the frame payloads of the block of compressed weight data do not contain signed compressed weight data when no weight value of any frame of the weight data set is a signed weight value.

The compressed sign value 508 may be used during decompression of the block of compressed weight data to determine whether the decompressed weight values are signed. For example, the compressed sign value 508 may be configured to represent that the frame payloads of the block of compressed weight data contain signed compressed weight data, and, as such, the decompressed weight values are signed. Decompressing signed weight values may include copying a value of a most significant bit of each compressed weight value, such as a sign bit, and using the value of the most significant bit as sign extended bits to decompress each respective compressed weight value. For another example, the compressed sign value 508 may be configured to represent that the frame payloads of the block of compressed weight data do not contain signed compressed weight data, and, as such, the decompressed weight values are unsigned. Decompressing unsigned weight values may include adding padding bits to each compressed weight value. The padding bits may be any combination or pattern of bit values. For example, the padding bits may be all the same bit value, such as all "0" or all "1". In some embodiments, the padding bits may be a bit value, or opposite of the bit value, of the most significant bit of the compressed weight value. In some embodiments, the compressed sign value 508 may be of any bit-width. For example, the compressed sign value 508 may be 1 bit.

In some embodiments, the global header 500 may include a frame header size 510 configured to represent a size of the frame headers (e.g., frame headers 404*a*, 404*b*, 404*c*, 404*d* in FIG. 4) in the block of compressed weight data. The frame header size 510 may be generated during compression of the weight data set. For example, the frame header size 510 may be generated based on a uniform size for all of the frame headers of the block of compressed weight data. In some embodiments, the frame header size 510 may be a preconfigured value. The frame header size 510 may be used during decompression of the block of compressed weight data to determine where frame headers and/or frame payloads are located within the block of compressed weight data. For example, the uniform size of the frame headers may be used to identify that data in the block of compressed weight data of the size of the frame headers may be a frame header and data in the block of compressed weight data not of the size of the frame headers be a frame payload. In some embodiments, frame header size 510 may be any bit-width. For example, the frame header size 510 may be 2 bits.

In some embodiments, the global header 500 may include an uncompressed width 512 configured to represent a bit-width of the uncompressed weight data. For example, the uncompressed width 512 may be configured to represent that the uncompressed weight may have a bit-width of a number of bits that is an exponential value of two, such as 2 bits, 4 bits, 8 bits, 16 bits, 32 bits, 64 bits, 128 bits, etc. The uncompressed width 512 may be generated during compression of the weight data set. For example, the uncompressed width 512 may be generated based on the bit-width of the weight values of the weight data set. For another example, the uncompressed width 512 may be a preconfigured value. The uncompressed width 512 may be used during decompression of the block of compressed weight data to determine the bit-width of the decompressed weight values. In some embodiments, uncompressed width 512 may be any bit-width. For example, the uncompressed width 512 may be 3 bits.

In some embodiments, the global header 500 may include an uncompressed buffer size 514 configured to represent a bit-width of a buffer configured for storing the uncompressed weight data. The uncompressed buffer size 514 may be generated during compression of the weight data set. For example, the uncompressed buffer size 514 may be generated based on the buffer size for the weight data set. For another example, the uncompressed buffer size 514 may be a preconfigured value. The uncompressed buffer size 514 may be used during decompression of the block of compressed weight data to determine the buffer size for the decompressed weight values. In some embodiments, uncompressed buffer size 514 may be any bit-width. For example, the uncompressed buffer size 514 may be 32 bits.

Figure 6:
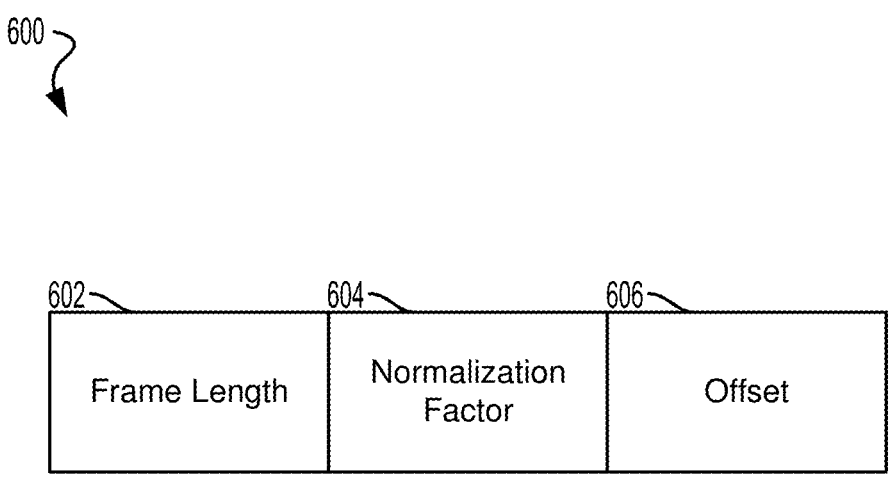
FIG. 6 is a block diagram illustrating an example of a frame header of a block of compressed weight data suitable for implementing various embodiments.

FIG. 6 illustrates example of a frame header of a block of compressed weight data (e.g., block of compressed weight data 400 in FIG. 4) suitable for implementing embodiments. With reference to FIGS. 1-6, a frame header 600 (e.g., frame header 404a, 404b. 404c, 404d in FIG. 4)) may be of any size and include parameters that may be applied for decompression of any combination and/or all of frame payloads (e.g., frame payloads 406a. 406b, 406c in FIG. 4) of the compressed weight data. A compression computing device (e.g., computing device 100) may have a processor (e.g., processor 104, AI processor 124 in FIG. 1, processor 202, AI processor 206 in FIG. 2) configured to compress a weight data set (e.g., weight data set 300 in FIGS. 3A and 3B). The compression of the weight data set may generate the frame header 600. A decompression computing device (e.g., computing device 100) may have a processor (e.g., processor 104, AI processor 124 in FIG. 1, processor 202, AI processor 206 in FIG. 2) configured to decompress the block of compressed weight data using the frame header 600. The frame header 600 may be stored at a memory (e.g., memory 106, 114 in FIG. 1, processor memory 204, memory 208 in FIG. 2) of the compression computing device and/or the decompression computing device.

In some embodiments, the frame header 600 may be associated with a frame (e.g., frame 302a, 302b. 302c, 302d, 302e, 304a, 304b, 304c, 304d in FIGS. 3A and 3B) in the weight data set. In some embodiments, the frame header 600 may be associated with a frame payload of the block of compressed weight data. In some embodiments, the frame header 600 may be included in the block of compressed weight data without an association with a frame payload. For example, the frame header 600 may be included in the block of compressed weight data without an association with a frame payload for a frame header 600 associated with a frame of the weight data containing all zero weight values. In some embodiments, the frame header 600 may be any bit-width. For example, the frame header 600 may be 8 bits.

The frame header 600 may include a frame length 602 configured to represent a number of weight values included in the associated frame of the weight data set. In some embodiments, the frame length 602 may be similarly configured to represent a number of compressed weight values included in the associated frame payload of the block of compressed weight data. In some embodiments, the frame length 602 may be similarly configured to represent a number of compressed weight values without an associated frame payload of the block of compressed weight data. For example, the frame length 602 may be configured to represent a number of compressed, contiguous zero weight values. The frame length 602 may be generated during compression of the weight data set. For example, the frame length 602 may be generated based on the number of weight values in the associated frame of the weight data set. For another example, the frame length 602 may be generated based on the number of compressed weight values in the associated frame payload. In some embodiments, the frame length 602 may be a preconfigured value. For example, the frame length 602 may be a preconfigured exponential value of exponential value of two, such as 2 bits, 4 bits, 8 bits, 16 bits, 32 bits, 64 bits, 128 bits, etc. For another example, the frame length 602 may be a value divisible by sixteen for 8-bit weight values. For another example, the frame length 602 may be a value divisible by eight for 16-bit weight values. The frame length 602 may be used during decompression of the block of compressed weight data to determine a number of weight values to decompress from the associated frame payload. In some embodiments, the frame length 602 may be used during decompression of the block of compressed weight data to determine a number of weight values to decompress for a frame header 600 not associated with a frame payload. For example, the frame length 602 may be used to determine a number of consecutive zero weight values to decompress. The frame length 602 may be any bit-width. For example, the frame length 602 may be 4 bits for 8-bit weight values. For another example, the frame length 602 may be 3 bits for 16-bit weight values.

The frame header 600 may include a normalization factor 604 configured to represent a number of padding bits removed from the weight values included in the associated frame of the weight data set. In some embodiments, the normalization factor 604 may be similarly configured to represent a number of padding bits to add to the compressed weight values included in the associated frame payload of the block of compressed weight data. In some embodiments, the normalization factor 604 may be configured to represent a number of bits removed from zero weight values included in the associated frame of the weight data set. In some embodiments, the normalization factor 604 may be similarly configured to represent a number of bits to add for compressed weight values without an associated frame payload of the block of compressed weight data. For example, the normalization factor 604 may be configured to represent a number of bits for zero weight values. The normalization factor 604 may be generated during compression of the weight data set. For example, the normalization factor 604 may be generated based on the number of bits removed from weight values in the associated frame of the weight data set to generate associated frame payloads. The normalization factor 604 may be used during decompression of the block of compressed weight data to determine a number of padding bits to add to the compressed weight values to decompress from the associated frame payload. In some embodiments, the normalization factor 604 may be used during decompression of the block of compressed weight data to determine a number of bits for zero weight values to decompress for a frame header 600 not associated with a frame payload. The normalization factor 604 may be any bit-width. For example, the normalization factor 604 may be 3 bits for 8-bit weight values. For another example, the normalization factor 604 may be 4 bits for 16-bit weight values.

In some embodiments, the normalization factor 604 may be substituted in the frame header 600, in the example illustrated in FIG. 6, by a compressed weight bit-width of the remaining bits of the weight values included in the associated frame of the weight data set after removal of the padding bits. During decompression the normalization factor 604 may be determined for a frame using the compressed weight bit-width of the associated frame and the uncompressed width (e.g., an uncompressed width 512 in FIG. 5) configured to represent a bit-width of the uncompressed weight data set. For example, the compressed weight bit-width of the associated frame may be subtracted from the uncompressed width to determine the normalization factor 604.

In some embodiments, the frame header 600 may include a normalization factor indicator, which may be the normalization factor 604. In some embodiments, the frame header 600 may include a normalization factor indicator, which may be the compressed weight bit-width substituted, in the example illustrated in FIG. 6, for the normalization factor 604.

The frame header 600 may include an offset indicator 606 configured to represent whether an offset (e.g., offset 502, 504 in FIG. 5) and/or which offset was applied to weight values included in the associated frame of the weight data set. In some embodiments, the offset indicator 606 may be similarly configured to represent whether an offset and/or which offset was applied to weight values compressed as the compressed weight values included in the associated frame payload of the block of compressed weight data. In some embodiments, the offset indicator 606 may be similarly configured to represent whether an offset and/or which offset is to be applied for decompressing the compressed weight values included in the associated frame payload of the block of compressed weight data. The offset indicator 606 may be a value associated with an offset included in a global header (e.g., global header 500 in FIG. 5) of the block of compressed weight data. For example, the offset indicator 606 may be a bit flag for which a first value is associated with a first offset in the global header and a second value is associated with a second value in the global header. The offset indicator 606 may indicate which of the offsets in the global header was used in compressing weight values of the weight data set and which of the offsets in the global header is to be used in decompressing the compressed weight values. The offset indicator 606 may be any bit-width. For example, the offset indicator 606 may be 1 bit.

The examples in FIGS. 4-6 are meant to be illustrative and do not limit the scope of the claims or the specification. The various features of the block of compressed weight data 400 in FIG. 4, the global header 500 in FIG. 5, and the frame header in FIG. 6 may be variably included and/or excluded, differently sized, and/or differently ordered.

Figure 7:
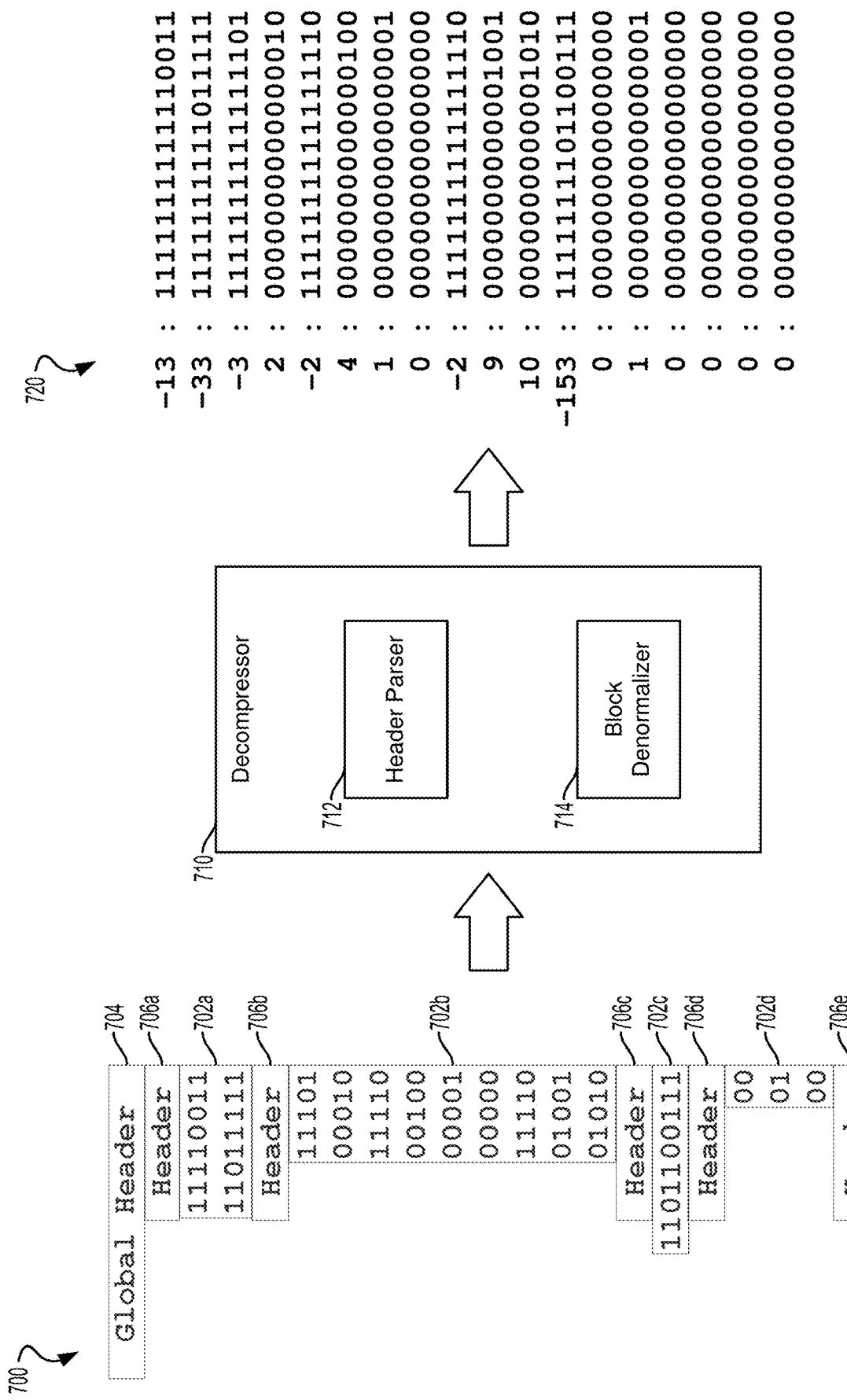
FIG. 7 is a data and component block diagram illustrating an example of decompression of compressed weight data suitable for implementing various embodiments.

FIG. 7 illustrates an example of decompression of a block compressed weight data (e.g., block of compressed weight data 400 in FIG. 4) suitable for implementing embodiments. With reference to FIGS. 1-7 a block of compressed weight data 700 may be decompressed to generate a block of decompressed weight data 720. A decompression computing device (e.g., computing device 100) may have a processor (e.g., processor 104, AI processor 124 in FIG. 1, processor 202, AI processor 206 in FIG. 2) configured to decompress the block of compressed weight data 700. The processor may be configured with circuitry and/or configured with software for implementing a decompressor 710. In some embodiments, software configured for implementing the decompressor 710 may be stored at a memory (e.g., memory 106, 114 in FIG. 1, processor memory 204, memory 208 in FIG. 2) of the decompression computing device. The decompression computing device may decompress the block of compressed weight data 700 using a global header 704 (e.g., global header 402 in FIG. 4, global header 500 in FIG. 5), frame headers 706a, 706b, 706c, 706d, 706e (e.g., frame headers 404a, 404b, 404c, 404d in FIG. 4, frame header 600 in FIG. 6), and/or frame payloads 702a, 702b, 702c, 702d (e.g., frame payloads 406a, 406b, 406c in FIG. 4) of the block of compressed weight data 700. In some embodiments, the block of compressed weight data 700 may be stored at a memory (e.g., memory 106, 114 in FIG. 1, processor memory 204, memory 208 in FIG. 2) of the decompression computing device.

The decompressor 710 may include a header parser 712 and a block denormalizer 714. The decompressor 710 may retrieve the block of compressed weight data 700. For example, the decompressor 710 may retrieve the block of compressed weight data 700 from the memory of the decompression computing device at which the block of compressed weight data 700 may be stored.

The header parser 712 may parse the global header 704 to retrieve parameters for decompressing the block of compressed weight data 700. The header parser 712 may also parse the frame headers 706a, 706b, 706c, 706d, to retrieve parameters for decompressing the associated frame payloads 702a, 702b, 702c, 702d. In some embodiments, the header parser 712 may also parse the frame header 706e, to retrieve parameters for decompressing zero weight values without an associated frame payload.

The block denormalizer 714 may use the parameters retrieved from the global header 704 and the frame headers 706a, 706b, 706c, 706d, 706e to decompress the block of compressed weight data 700. More specifically, the block denormalizer 714 may use the parameters retrieved from the global header 704 and the frame headers 706a, 706b, 706c, 706d to decompress the associated frame payloads 702a, 702b, 702c. 702d. Moreover, the block denormalizer 714 may use the parameters retrieved from the global header 704 and the frame header 706e to decompress zero weight values without an associated frame payload. In some embodiments, the block denormalizer 714 may decompress the weight values of the frame payloads 702a, 702b, 702c, 702d by shifting each of the compressed weight values by a number of bits of a normalization factor (e.g., normalization factor 604 in FIG. 6) from the associated frame headers 706a, 706b, 706c, 706d. In some embodiments, the block denormalizer 714 may use bitwise arithmetic operations to adjust the values of the added padding bits. For example, the block denormalizer 714 may use bitwise arithmetic operations to adjust the values of the added padding bits to match the most significant bit of the compressed weight values. As a further example, the block denormalizer 714 may use bitwise arithmetic operations to adjust the values of added sign extended bits to match the most significant bit, such as a sign bit, of the compressed weight values. The decompressed weight values may be grouped as the block of decompressed weight data 720.

For example, the block denormalizer 714 may use the parameters retrieved from the global header 704 and the frame header 706a to decompress associated frame payload 702a. In this example, the block denormalizer 714 may retrieve, from the frame header 706a, a frame length (e.g., frame length 602 in FIG. 6) configured to represent a group of two weight values, a normalization factor configured to represent eight padding bits, and an offset indicator (e.g., offset indicator 606 in FIG. 6) configured to indicate that no offset is to be used for decompressing frame payload 702a. The block denormalizer 714 may apply the normalization factor to the two compressed weight values of the frame payload 702a, adding eight padding bits to each of the compressed weight values. In this example, the block denormalizer 714 may copy the value of the most significant bit of each compressed weight value and use the value of the most significant bit as the padding bits to decompress each respective compressed weight value. As a further example, the block denormalizer 714 may copy the value of the most significant bit of each compressed weight value, such as a sign bit, and use the value of the most significant bit as sign extended bits to decompress each respective compressed weight value. The full bit-width decompressed weight values, having the padding bits and the significant bits, may be used as part of the block of decompressed weight data 720.

For further example, the block denormalizer 714 may use the parameters retrieved from the global header 704 and the frame header 706b to decompress associated frame payload 702b. In this example, the block denormalizer 714 may retrieve, from the frame header 706b, a frame length configured to represent a group of nine weight values, a normalization factor configured to represent eleven padding bits, and an offset indicator configured to indicate that no offset is to be used for decompressing frame payload 702b. The block denormalizer 714 may apply the normalization factor to the nine compressed weight values of the frame payload 702b, adding eleven padding bits to each of the compressed weight values. In this example, the block denormalizer 714 may copy the value of the most significant bit of each compressed weight value and use the value of the most significant bit as the padding bits to decompress each respective compressed weight value. As a further example, the block denormalizer 714 may copy the value of the most significant bit of each compressed weight value, such as a sign bit, and use the value of the most significant bit as sign extended bits to decompress each respective compressed weight value. The full bit-width decompressed weight values, having the padding bits and the significant bits, may be used as part of the block of decompressed weight data 720.

For further example, the block denormalizer 714 may use the parameters retrieved from the global header 704 and the frame header 706c to decompress associated frame payload 702c. In this example, the block denormalizer 714 may retrieve, from the frame header 706c, a frame length configured to represent a group of one weight value, a normalization factor configured to represent six padding bits, and an offset indicator configured to indicate that no offset is to be used for decompressing frame payload 702c. The block denormalizer 714 may apply the normalization factor to the one compressed weight value of the frame payload 702c, adding six padding bits to each of the compressed weight values. In this example, the block denormalizer 714 may copy the value of the most significant bit of the compressed weight value and use the value of the most significant bit as the padding bits to decompress the compressed weight value. As a further example, the block denormalizer 714 may copy the value of the most significant bit, such as a sign bit, of the compressed weight value and use the value of the most significant bit as sign extended bits to decompress the compressed weight value. The full bit-width decompressed weight values, having the padding bits and the significant bits, may be used as part of the block of decompressed weight data 720.

For further example, the block denormalizer 714 may use the parameters retrieved from the global header 704 and the frame header 706d to decompress associated frame payload 702d. In this example, the block denormalizer 714 may retrieve, from the frame header 706d, a frame length configured to represent a group of three weight values, a normalization factor configured to represent fourteen padding bits, and an offset indicator configured to indicate that no offset is to be used for decompressing frame payload 702d. The block denormalizer 714 may apply the normalization factor to the three compressed weight values of the frame payload 702d, adding fourteen padding bits to each of the compressed weight values. In this example, the block denormalizer 714 may copy the value of the most significant bit of each compressed weight value and use the value of the most significant bit as the padding bits to decompress each respective compressed weight value. As a further example, the block denormalizer 714 may copy the value of the most significant bit of each compressed weight value, such as a sign bit, and use the value of the most significant bit as sign extended bits to decompress each respective compressed weight value. The full bit-width decompressed weight values, having the padding bits and the significant bits, may be used as part of the block of decompressed weight data 720.

For further example, the block denormalizer 714 may use the parameters retrieved from the global header 704 and the frame header 706e to decompress zero weight values without an associated frame payload. In this example, the block denormalizer 714 may retrieve, from the frame header 706e, a frame length configured to represent a group of three weight values, a normalization factor configured to represent sixteen padding bits, and an offset indicator configured to indicate that no offset is to be used for decompressing the zero weight values. The block denormalizer 714 may apply the normalization factor to the three compressed weight values for the zero weight values, adding sixteen bits for each of the compressed zero weight values. In this example, the block denormalizer 714 may add sixteen zero value bits to decompress each respective compressed zero weight value. The full bit-width decompressed weight values, having the padding bits and the significant bits, may be used as part of the block of decompressed weight data 720.

In some embodiments, weight values of the weight data set may have been modified by an offset value (e.g., offset 502, 504 in FIG. 5) as part of compressing the weight values. For such modified weight values, a frame header for an associated frame payload, having the compressed weight values derived from the modified weight values, may include an offset indicator configured to indicate that an offset is to be used for decompressing the frame payload. Following applying a normalization factor of the frame header to the compressed weights of the frame payload, the block denormalizer 714 may modify the full bit-width weight values of the frame payload by the offset value. The full bit-width decompressed weight values, having the padding bits and the significant bits, may be used as part of the block of decompressed weight data 720.

The examples in FIG. 7 are meant to be illustrative and do not limit the scope of the claims or the specification. The block of compressed weight data 700 and the block of decompressed weight data 720 may include any number of weight values and the weight values may be of any size and/or format. The processor of the decompression computing device decompressing the compressed weight data 700 and generating the decompressed weight data 720 may do so using any number and combination of global headers, frame headers, and frame payloads. Similarly, the processor of the decompression computing device decompressing the compressed weight data 700 and generating the decompressed weight data 720 may do so using any number, combination, and value of offsets, frame lengths, normalization factors, and compressed weight values.

Figure 8:
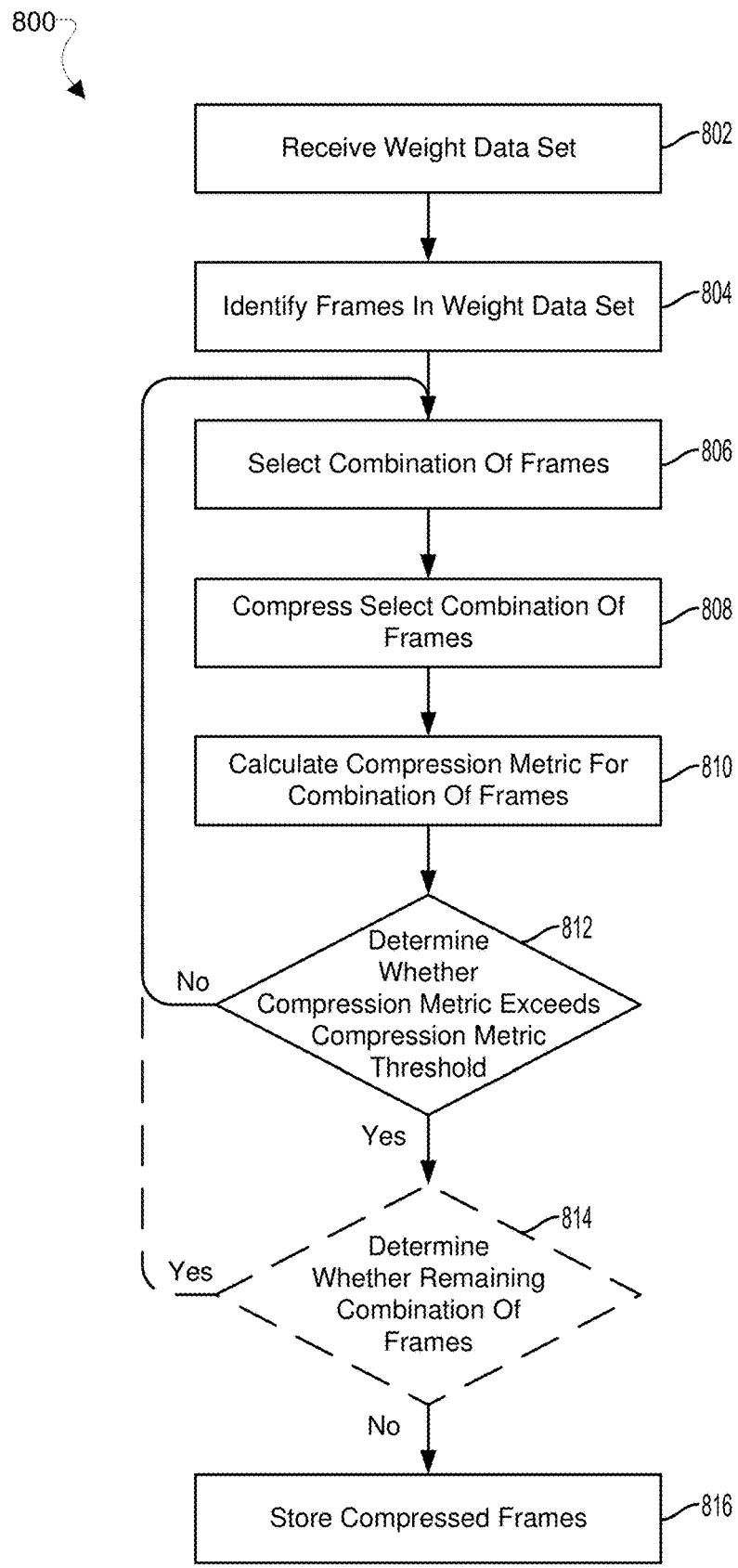
FIG. 8 is process flow diagram illustrating a method for compressing weight data according to an embodiment.

FIG. 8 illustrates a method 800 for compressing weight data according to an embodiment. With reference to FIGS. 1-8, the method 800 may be implemented in a computing device (e.g., computing device 100 in FIG. 1), in hardware, in software executing in a processor, or in a combination of a software-configured processor and dedicated hardware (e.g., processor 104, memory 106, 114, AI processor 124, in FIG. 1, processor 202, processor memory 204, AI processor 206, memory 208 in FIG. 2). In order to encompass the alternative configurations enabled in various embodiments, the hardware implementing the method 800 is referred to herein as a "compression processing device."

In block 802, the compression processing device may receive a weight data set (e.g., weight data set 300 in FIGS. 3A and 3B). In some embodiments the weight data set may be retrieved from a memory by the compression processing device. In some embodiments, the compression processing device retrieving the weight data set in block 802 may be a processor or an AI processor.

In block 804, the compression processing device may identify frame (e.g., frames 302a, 302b, 302c. 302d, 302e, 304a, 304b. 304c, 304d in FIGS. 3A and 3B) in the weight data set that can be removed from the weight values for lossless compression based on selective search criteria. The identification of frames may be implemented by a search algorithm. In some embodiments, the search algorithm may be configured to identify every frame. In some embodiments, the search algorithm may be an exhaustive search algorithm. In some embodiments, the search algorithm may be configured to identify frames based on selective search criteria that may limit the number of frames. In some embodiments, the search algorithm may be configured to identify frames based on selective search criteria that may prioritize certain frames and/or certain combinations of frames. For example, the selective search criteria may include a frame length, a range of frame lengths, a normalization factor representing a number of padding bits that can be removed from the weight values of a frame, a range of normalization factors, a weight value, a range of weight values, an offset value, a range of offset values, etc. A neural network may use weights quantized to a certain size. For example, a neural network may use weights quantized to 4-bits, 8-bits, 16 bits, etc. However, not all weight values may use the full quantization size. Therefore, a weight value may include significant bits, which may include a sign bit, and padding bits. In some embodiments, the padding bits may be repetitive bit values, such as bit values repeating the most significant bit and/or different from the most significant bit of a weight value. In some embodiments, the padding bits may be sign extended bits.

An analysis of the weight data set may identify patterns in contiguous weight values of padding bits that may be removed from the weight values without loss. For example, the patterns of padding bits that may be removed from the weight values without loss may be a shared number of some and/or all of the padding bits in contiguous weight values. The patterns of padding bits that may be removed from the weight values without loss in the contiguous weight values may be identified based on a number of contiguous weight values. The contiguous weight values exhibiting a pattern may be grouped as a frame. In some embodiments, the identification of weight values exhibiting the patterns identify overlapping frames. In some embodiments, the compression processing device identifying frames in the weight data set in block 804 may be a processor or an AI processor.

In block 806, the compression processing device may select a combination of frames. The selection of frames may be implemented by a search algorithm. In some embodiments, the search algorithm may be configured to select every combination of frames. In some embodiments, the search algorithm may be an exhaustive search algorithm. In some embodiments, the search algorithm may be configured to select combinations of frames based on selective search criteria that may limit the number of combinations of frames. In some embodiments, the search algorithm may be configured to select combinations of frames based on selective search criteria that may prioritize certain frames and/or certain combinations of frames. For example, the selective search criteria may include a frame length, a range of frame lengths, a normalization factor, a range of normalization factors, a weight value, a range of weight values, an offset value, a range of offset values, etc. In some embodiments, selection of the frames may select non-overlapping frames.

In some embodiments, the selected frames may be contiguous frames. In some embodiments, the selected frames may be non-contiguous frames. In some embodiments, the compression processing device selecting the combination of frames in block 806 may be a processor or an AI processor.

In block 808, the compression processing device may compress the selected combination of frames. Compression of the selected combination of frames is described further herein described in the method 900 with reference to FIG. 9 and in the method 1000 with reference to FIG. 10. In some embodiments, the compression processing device compressing the selected frames in block 808 may be a processor or an AI processor.

In block 810, the compression processing device may calculate a compression metric for the selected combination for frames. The compression metric may be based on a compression ratio, compression size, etc. The compression processing device calculating a compression metric for the selected combination for frames in block 810 may be a processor or an AI processor.

In determination block 812, the compression processing device may determine whether the compression metric meets and/or exceeds a compression metric threshold. The compression metric threshold may be based on a compression ratio, compression size, etc. In some embodiments the compression metric threshold may be a predetermined value. A combination of frames that meets and/or exceeds the compression metric threshold may be used for compressing the weight data set. In some embodiments the compression metric threshold may be set to a best compression metric from an analysis of the compression metrics of multiple sets of selected combinations of frames. For example, the compression metric of a first selected combination of frames may be set as the compression metric threshold, and the compression metric of any successive selected combination of frames exceeding the compression metric threshold may be set as the compression metric threshold. Once no selected combination of frames can exceed the compression metric threshold, the compression metric threshold may be the best compression metric. The combination of frames associated with the best compression metric may be the combination of frames to be used for compressing the weight data set as described further herein. The compression processing device determining whether the compression metric meets and/or exceeds a compression metric threshold in determination block 812 may be a processor or an AI processor.

In response to determining that the compression metric does not meet and/or does not exceed a compression metric threshold (i.e., determination block 812="No"), the compression processing device may select a combination of frames in block 806, as previously described herein.

In response to determining that the compression metric does meet and/or does exceed a compression metric threshold (i.e., determination block 812="Yes"), the compression processing device may determine whether there is a remaining combination for frames in optional determination block 814. As discussed above, the best compression metric may be based on comparison of each of the combinations of frames to the compression metric threshold. Therefore, when combinations of frames remain to be compared to the compression metric threshold, the remaining combinations of frames may be compared to the compression metric threshold. In some embodiments, the compression processing device may determine whether there is a remaining combination for frames from a list, table, array, queue, stack, etc. of combinations of frames. The compression processing device determining whether there is a remaining combination for frames in optional determination block 814 may be a processor or an AI processor.

In response to determining that there is a remaining combination for frames (i.e., optional determination block 814="Yes"), the compression processing device may select a combination of frames in block 806, as previously described herein.

In response to determining that the compression metric does meet and/or does exceed a compression metric threshold (i.e., determination block 812="Yes"), or in response to determining that there is not a remaining combination for frames (i.e., optional determination block 814="No"), the compression processing device may store the compressed selected combination of frames in block 816. The compressed selected combination of frames may be stored in a memory configured for persistent storage. The compression processing device storing the compressed selected combination of frames in block 816 may be a processor or an AI processor.

Figure 9:
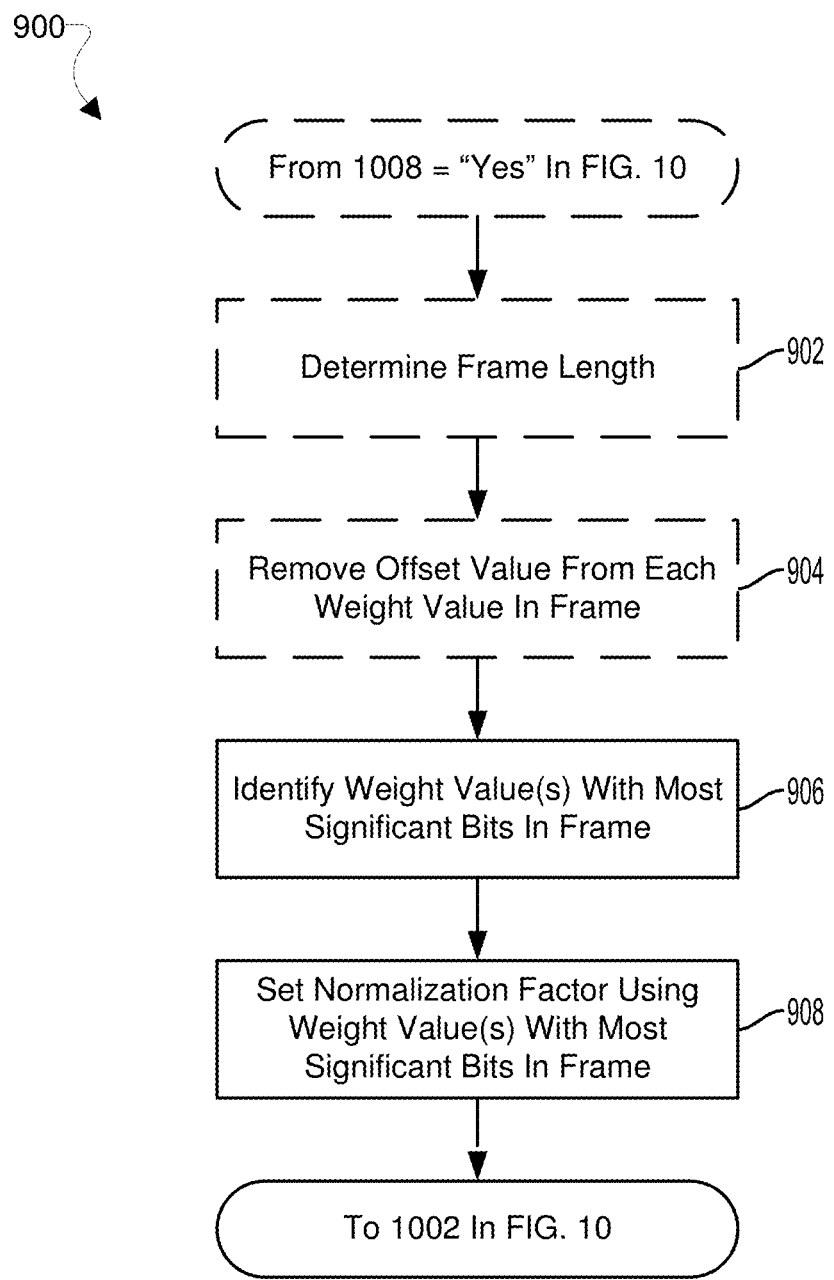
FIG. 9 is a process flow diagram illustrating a method for setting weight data compression parameters according to an embodiment.

FIG. 9 illustrates a method 900 for setting weight data compression parameters according to an embodiment. With reference to FIGS. 1-9, the method 900 may be implemented in a computing device (e.g., computing device 100 in FIG. 1), in hardware, in software executing in a processor, or in a combination of a software-configured processor and dedicated hardware (e.g., processor 104, memory 106, 114, AI processor 124, in FIG. 1, processor 202, processor memory 204, AI processor 206, memory 208 in FIG. 2). In order to encompass the alternative configurations enabled in various embodiments, the hardware implementing the method 900 is referred to herein as a "compression processing device." In some embodiments, the method 900 may further describe block 808 of the method 800 described with reference to FIG. 8.

In optional block 902, the compression processing device may determine a frame length of a selected frame (e.g., frame 302a, 302b, 302c, 302d, 302e, 304a, 304b, 304c, 304d in FIGS. 3A and 3B). In some embodiments, the frame length may be based on a number of contiguous weight values exhibiting a pattern of padding bits that may be removed from the weight values without loss as used in identifying frames in a weight data set (e.g., weight data set 300 in FIGS. 3A and 3B) as described for block 804 in the method 800 described with reference to FIG. 8. In some embodiments, the frame length may be predetermined during identifying frames in a weight data set as described for block 804 in the method 800 described with reference to FIG. 8, and optional block 902 may not need to be implemented. The compression processing device determining the frame length of a selected frame in optional block 902 may be a processor or an AI processor.

In optional block 904 the compression processing device may remove an offset value from each weight value in a frame. The use of an offset value may be optional and block 904 may not be implemented for embodiments in which the offset value is not used. In some embodiments, no offset value may be used for compression of the frames selected as described for block 806 in the method 800 described with reference to FIG. 8. In some embodiments, an offset value may be used for compression of the frames selected having at least some weight values for which the number of significant bits may be reduced by removing the offset value from the weight values. In some embodiments, removal of the offset value from weight values of a frame may depend on whether removal of the offset value from the weight value results in modified weight values with fewer significant bits or more padding bits that a weight value of the frame having the most significant bits or least padding bits. In some embodiments, the offset value may be predetermined. In some embodiments, the offset value may be determined based on a value that may reduce the highest number of significant bits or increase the lowest number of padding bits for the weights of the frame. In some embodiments the offset value may be removed by adding or subtracting the offset value and the weight values in the frame. The compression processing device removing the offset value from each weight value in the frame in optional block 904 may be a processor or an AI processor.

In block 906, the compression processing device may identify a weight value with the most significant bits or least padding bits in the frame. The compression processing device may analyze the bits of the weight values to determine the significant bits representing a value of the weight value, including a signed value, and compare which of the weight values has the most significant bits. Similarly, the compression processing device may analyze the bits of the weight values to determine the padding bits of a value of the weight value, and compare which of the weight values has the least padding bits. The compression processing device identifying the weight value with the most significant bits or least padding bits in the frame in block 906 may be a processor or an AI processor.

In block 908, the compression processing device may set a normalization factor for the frame using the weight value with the most significant bits or least padding bits in frame. A normalization factor may represent a number of padding bits that can be removed from the weight values of each frame. Setting the normalization factor may include determining a number of padding bits of the weight value with the most significant bits or least padding bits in frame, and setting the normalization factor to the number of padding bits. In some embodiments, multiple weight values may have the most significant bits or the least padding bits, and the compression processing device may select any of the weight values to set the normalization factor. In some embodiments, the compression processing device may determine whether all of the bits of the frame are zero value. In other words, the compression processing device may determine whether all of the weight values in the frame are zero values. The compression processing device may analyze each bit of the weight values in the frame to determine their value and determine whether each bit has a zero value. In response to determining that all of the bits of the frame are zero value, the compression processing device may set the normalization factor to a full bit-width of the weight values of the frame. In other words, the compression processing device may treat all of the bits of the weight values as padding bits and set the normalization factor to all of the bits of a weight value. The compression processing device setting the normalization factor for the frame using the weight value with the most significant bits or least padding bits in frame in block 908 may be a processor or an AI processor.

Figure 10:
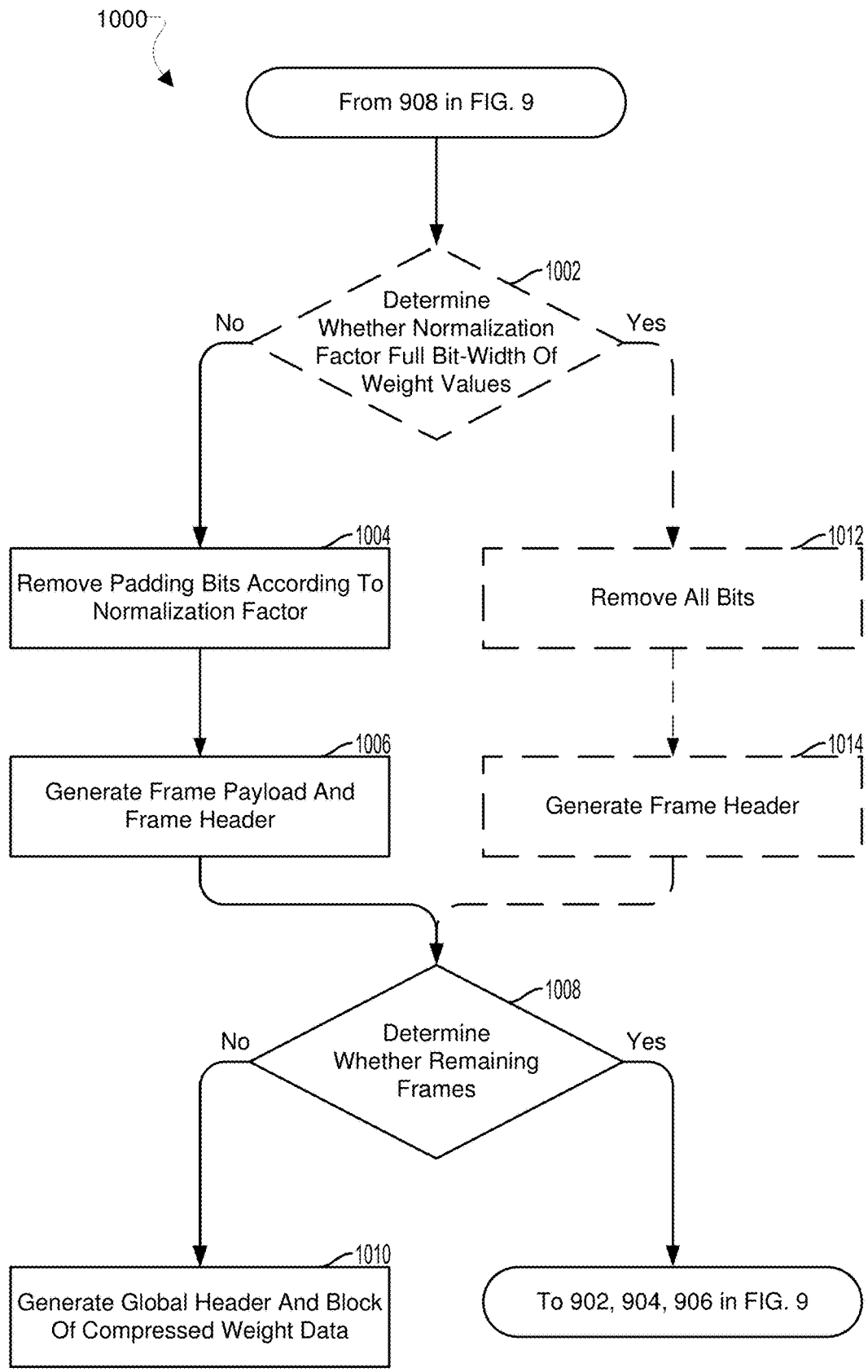
FIG. 10 is a process flow diagram illustrating a method for compressing weight data according to an embodiment.

FIG. 10 illustrates a method 1000 for compressing weight data according to an embodiment. With reference to FIGS. 1-10, the method 1000 may be implemented in a computing device (e.g., computing device 100 in FIG. 1), in hardware, in software executing in a processor, or in a combination of a software-configured processor and dedicated hardware (e.g., processor 104, memory 106, 114, AI processor 124, in FIG. 1, processor 202, processor memory 204, AI processor 206, memory 208 in FIG. 2). In order to encompass the alternative configurations enabled in various embodiments, the hardware implementing the method 1000 is referred to herein as a "compression processing device." In some embodiments, the method 1000 may be implemented in continuation of the method 900 described herein with reference to FIG. 9.

In optional determination block 1002, the compression processing device may determine whether a normalization factor for a frame (e.g., frame 302a. 302b, 302c, 302d, 302e. 304a, 304b, 304c, 304d in FIGS. 3A and 3B) in a weight data set (e.g., weight data set 300 in FIGS. 3A and 3B) is the full bit-width of the weight values of the frame. The normalization factor for the frame may be the normalization factor set for the frame in block 908 of the method 900 described herein with reference to FIG. 9. In some embodiments, the compression processing device may determine the bit-width of the weight values of the frame by analyzing a weight value of the frame and determining the bit-width of the weight value. In some embodiments, the bit-width of the weight values of the frame may be a preconfigured value. For example, the bit-width of the weight values of the frame may be an exponential value of two, such as 2 bits, 4 bits, 8 bits, 16 bits, 32 bits, 64 bits, 128 bits, etc. The compression processing device determining whether the normalization factor for the frame is the full bit-width of the weight values of the frame in optional determination block 1002 may be a processor or an AI processor.

In block 1004 the compression processing device may remove padding bits from the weight values of the frame according to a normalization factor. The normalization factor may be configured to represent a number of padding bits to be removed from the weight values of the frame. The number of padding bits to be removed from the frame represented by the normalization factor may be read by the compression processing device, which may remove the number of padding bits from each of the weight values of the frame. In some embodiments, removing the padding bits may involve shifting the remaining bits of the weight values of the frame to overwrite the padding bits being removed. The remaining bits of the weight values following removal of the padding bits may be referred to as the compressed weight bit-width. The compression processing device removing the padding bits from the weight values of the frame according to the normalization factor in block 1004 may be a processor or an AI processor. In some embodiments, the compression processing device may remove the padding bits from the weight values of the frame according to the normalization factor in block 1004 in response to determining that the normalization factor for the frame is not the full bit-width of the weight values of the frame (i.e., optional determination block 1002="No").

In block 1006, the compression processing device may generate a frame payload (e.g., frame payloads 406a, 406b. 406c in FIG. 4, frame payload 702a, 702b, 702c, 702d in FIG. 7) and a frame header (e.g., frame header 404a. 404b, 404c in FIG. 4, frame header 600 in FIG. 6, frame header 706a. 706b, 706c, 706d in FIG. 7) for the frame. Generating the frame payload for the frame may include storing the remaining bits of the weight values of the frame. The stored remaining bits of the weight values of the frame may be the compressed weight values of the frame. Generating the frame header for the frame may include storing compression parameters for and in association with the frame payload that may be used for decompression of the compressed weight values. The compression parameters may include a frame length (e.g., frame length 602 in FIG. 6), a normalization factor indicator (e.g., normalization factor 604 in FIG. 6, compressed weight bit-width described with reference to FIG. 6), and/or an offset indicator (e.g., offset indicator 606 in FIG. 6). The frame length may be the frame length determined for the frame in block 902 of the method 900 as described herein with reference to FIG. 9. The normalization factor indicator may be the normalization factor set for the frame in block 908 of the method 900 described herein with reference to FIG. 9. The normalization factor indicator may be the compressed weight bit-width resulting from the removal of the padding bit in block 1004. The offset indicator may be a value based on whether and/or which offset factor is applied to the weight values of the frame in optional block 904 in the method 900 described herein with reference to FIG. 9. The frame header and frame payload may be stored in association with each other in a memory. The compression processing device generating the frame payload and the frame header for the frame in block 1006 may be a processor or an AI processor.

In response to determining that the normalization factor for the frame is the full bit-width of the weight values of the frame (i.e., optional determination block 1002="Yes"), the compression processing device may remove all of the bits from the weight values in the frame in optional block 1012. The compression processing device removing all of the bits from the weight values in the frame in optional block 1012 may be a processor or an AI processor.

In block optional 1014, the compression processing device may a frame header (e.g., frame header 404d in FIG. 4, frame header 600 in FIG. 6, frame header 706e in FIG. 7) for the frame. Generating the frame header in block 1014 may be implemented in a manner similar to generating the frame header in block 1006. For a frame for which all of the bits are removed from the weight values, no frame payload may be generated. The compression processing device generating the frame payload for the frame in optional block 1014 may be a processor or an AI processor.

Following generating the frame payload and the frame header for the frame in block 1006 or generating the frame payload for the frame in optional block 1014, the compression processing device may determine whether there is a remaining frame in determination block 1008. The compression processing device may determine whether there is a remaining frame from a list, table, array, queue, stack, etc. of frames. The compression processing device determining whether there is a remaining frame in determination block 1008 may be a processor or an AI processor.

In response to determining that there is not a remaining frame (i.e., determination block 1008="No"), the compression processing device may generate a global header (e.g., global header 402 in FIG. 4, global header 500 in FIG. 5, global header 704 in FIG. 7) and a block of compressed weight data (e.g., block of compressed weight data (e.g., block of compressed weight data 400 in FIG. 4, block of compressed weight data 70) in FIG. 7) in block 1010. Generating the global header for the block of compressed weight data may include storing compression and weight data set parameters for and in association with the frame headers and frame payloads. The compression parameters may include an offset (e.g., offset 502, 504 in FIG. 5). The offset may be the value of the offset applied to the weight values of a frame in block 904 of the method 900 described herein with reference to FIG. 9. In some embodiments, the global header may include any number of reserved bits (e.g., reserved bits 506 in FIG. 5), which may be configured for providing a parameter for decompressing block of compressed weight data.

In some embodiments, the global header may include a compressed sign value (e.g., compressed sign value 508 in FIG. 5) configured to represent whether the frame payloads of the block of compressed weight data contain signed compressed weight data. The compressed sign value may be generated during compression of the weight data set.

In some embodiments, the global header may include a frame header size (e.g., frame header size 510 in FIG. 5) configured to represent a size of the frame headers in the block of compressed weight data. The frame header size may be generated during compression of the weight data set. For example, the frame header size may be generated based on a uniform size for all of the frame headers of the block of compressed weight data. In some embodiments, the frame header size may be a preconfigured value.

In some embodiments, the global header may include an uncompressed width (e.g., an uncompressed width 512 in FIG. 5) configured to represent a bit-width of the uncompressed weight data set. For example, the uncompressed width may be configured to represent that the uncompressed weight may have a bit-width of a number of bits that is an exponential value of two, such as 2 bits, 4 bits, 8 bits, 16 bits, 32 bits, 64 bits, 128 bits, etc. The uncompressed width may be generated during compression of the weight data set. For example, the uncompressed width may be generated based on the bit-width of the weight values of the weight data set. For another example, the uncompressed width may be a preconfigured value. In some embodiments, the global header may include an uncompressed buffer size (e.g., uncompressed buffer size 514 in FIG. 5) configured to represent a bit-width of a buffer configured for storing the uncompressed weight data set. The uncompressed buffer size may be generated during compression of the weight data set. For example, the uncompressed buffer size may be generated based on the buffer size for the weight data set. For another example, the uncompressed buffer size may be a preconfigured value.

Generating the block of compressed weight data may include storing the global header, the frame headers, and frame payloads in association with each other in a memory. The compression processing device generating the global header and the block of compressed weight data in block 1010 may be a processor or an AI processor.

In response to determining that there is not a remaining frame (i.e., determination block 1008="No"), the compression processing device may: determine a frame length of a selected frame in optional block 902 of the method 900 described herein with reference to FIG. 9; remove an offset value from each weight value in a frame in optional block 904 of the method 900 described herein with reference to FIG. 9; or identify a weight value with the most significant bits or least padding bits in the frame in block 906 of the method 900 described herein with reference to FIG. 9.

Figure 11:
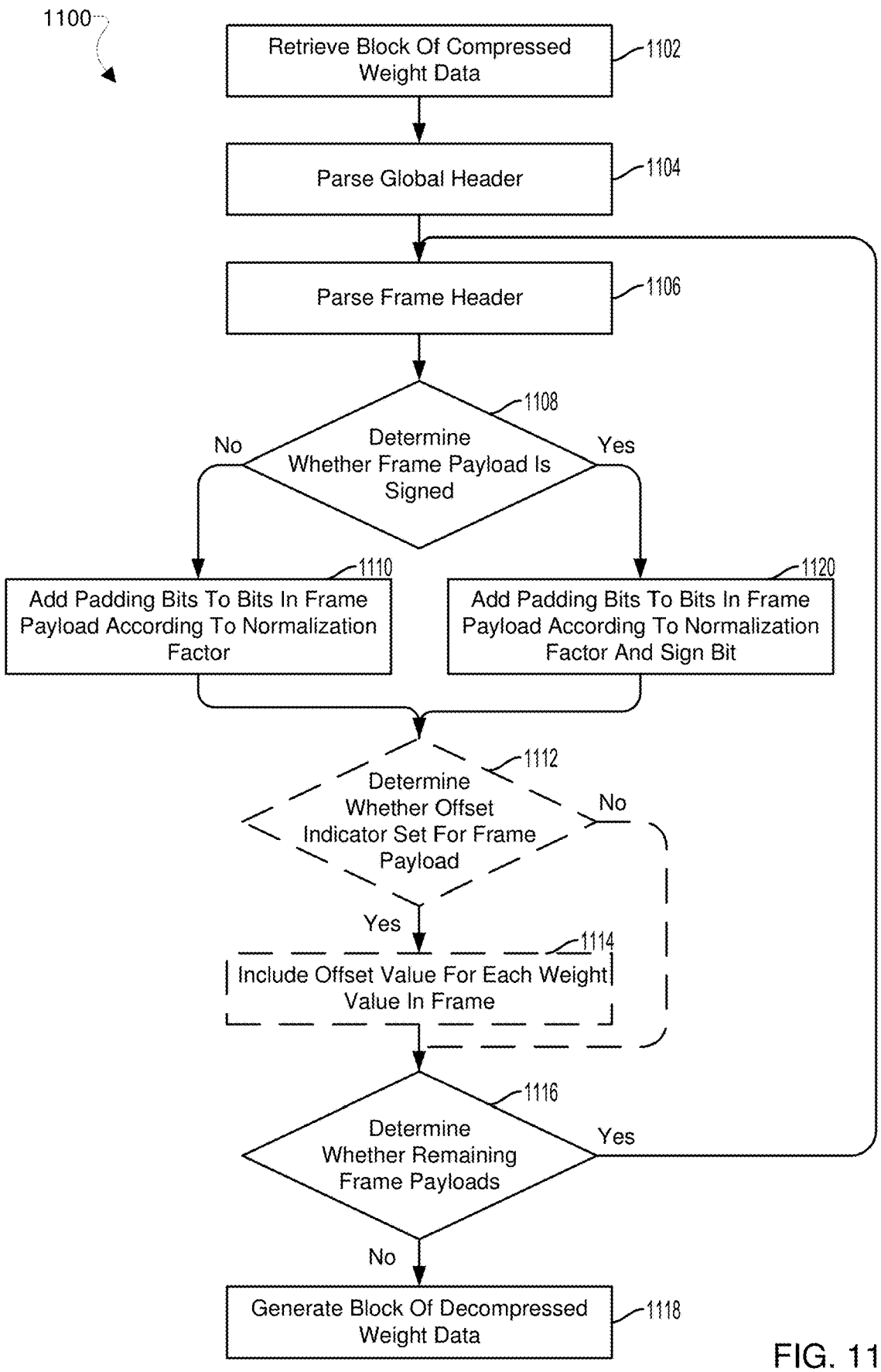
FIG. 11 is a process flow diagram illustrating a method for decompressing compressed weight data according to an embodiment.

FIG. 11 illustrates a method 1100 for decompressing weight data according to an embodiment. With reference to FIGS. 1-11, the method 1100 may be implemented in a computing device (e.g., computing device 100 in FIG. 1), in hardware, in software executing in a processor, or in a combination of a software-configured processor and dedicated hardware (e.g., processor 104, memory 106, 114, AI processor 124, in FIG. 1, processor 202, processor memory 204, AI processor 206, memory 208 in FIG. 2, decompressor 710, header parser 712, block denormalizer 714 in FIG. 7). In order to encompass the alternative configurations enabled in various embodiments, the hardware implementing the method 1100 is referred to herein as a "decompression processing device."

In block 1102, the decompression processing device may retrieve a block of compressed weight data (e.g., block of compressed weight data 400 in FIG. 4, block of compressed weight data 700 in FIG. 7). The block of compressed weight data may be retrieved from a memory of a computing device, such as a processor memory on an SoC (e.g., SoC 102 in FIG. 1, SoC 300 in FIG. 3) and/or a memory separate from the SoC. The decompression processing device retrieving the block of compressed weight data in block 1102 may be a processor or an AI processor.

In block 1104, the decompression processing device may parse a global header (e.g., global header 402 in FIG. 4, global header 500 in FIG. 5, global header 704 in FIG. 7) of the block of compressed weight data. The global header may be parsed to retrieve parameters for decompressing the block of compressed weight data. In some embodiments, the parameters for decompressing the block of compressed weight data retrieved from the global header may include an offset (e.g., offset 502, 504 in FIG. 5). In some embodiments, the parameters for decompressing the block of compressed weight data retrieved from the global header may include a compressed sign value (e.g., compressed sign value 508 in FIG. 5) configured to represent whether the frame payloads (e.g., frame payloads 406a, 406b, 406c in FIG. 4, and frame payload 702a, 702b, 702c, 702d in FIG. 7) of the block of compressed weight data contain signed compressed weight data. In some embodiments, the parameters for decompressing the block of compressed weight data retrieved from the global header may include a frame header size (e.g., frame header size 510 in FIG. 5) configured to represent a size of the frame headers (e.g., frame header 404a, 404b, 404c, 404d in FIG. 4, frame header 600 in FIG. 6, frame header 706a, 706b, 706c, 706d, 706e in FIG. 7) in the block of compressed weight data. In some embodiments, the parameters for decompressing the block of compressed weight data retrieved from the global header may include an uncompressed width (e.g., an uncompressed width 512 in FIG. 5) configured to represent a bit-width of the uncompressed weight data set. For example, the uncompressed width may be configured to represent that the uncompressed weight may have a bit-width of a number of bits that is an exponential value of two, such as 2 bits, 4 bits, 8 bits, 16 bits, 32 bits, 64 bits, 128 bits, etc. In some embodiments, the global header may include an uncompressed buffer size (e.g., uncompressed buffer size 514 in FIG. 5) configured to represent a bit-width of a buffer configured for storing the uncompressed weight data set. The decompression processing device parsing the global header of the block of compressed weight data in block 1104 may be a processor or an AI processor.

In block 1106, the decompression processing device may parse a frame header of the block of compressed weight data. The frame header may be parsed to retrieve parameters for decompressing the block of compressed weight data. Individual frame headers may be parsed to retrieve parameters for decompressing the associated frame payloads. In some embodiments, individual frame headers may be parsed to retrieve parameters for decompressing zero weight values without an associated frame payload. In some embodiments, the parameters for decompressing the block of compressed weight data retrieved from the frame header may include a frame length (e.g., frame length 602 in FIG. 6), a normalization factor (e.g., normalization factor 604 in FIG. 6), and/or an offset indicator (e.g., offset indicator 606 in FIG. 6). The frame length may be configured to represent a number of weight values included in the associated frame of the weight data set. In some embodiments, the frame length 602 may be similarly configured to represent a number of compressed weight values included in the associated frame payload of the block of compressed weight data. In some embodiments, the frame length 602 may be similarly configured to represent a number of compressed weight values without an associated frame payload of the block of compressed weight data. The normalization factor may be configured to represent a number of padding bits to add to the compressed weight values included in the associated frame payload. In some embodiments, the normalization factor may be configured to represent a number of bits to add for compressed weight values without an associated frame payload. The offset indicator 606 configured to represent whether an and/or which offset is to be applied for decompressing the compressed weight values included in the associated frame payload. The decompression processing device parsing the frame header of the block of compressed weight data in block 1106 may be a processor or an AI processor.

In determination block 1108, the decompression processing device may determine whether a frame payload of the block of compressed weight data is signed. The compressed weight data of the frame payload may include signed and/or unsigned weight values. Having at least one signed weight value may make the frame payload signed. In some embodiments, having at least one signed weight value in the compressed weight data may make all the frame payloads signed. Determining whether the frame payload is signed may be based on the compressed sign value retrieved from the global header in block 1104. The decompression processing device determining whether a frame payload of the block of compressed weight data is signed in determination block 1108 may be a processor or an AI processor.

In response to determining that the frame payload of the block of compressed weight data is not signed (i.e., determination block 1108="No"), the decompression processing device may add padding bits to the bits in the frame payload according to a normalization factor in block 1110. The normalization factor may be used to indicate to the decompression processing device how many padding bits to add to the bits of each compressed weight value of the frame payload so that the bit-width of each decompressed weight value totals to the bit-width of the original, uncompressed weight values of the weight data set. In some embodiments, the decompression processing device may add padding bits to the bits in the frame payload by shifting each of the compressed weight values by a number of bits of the normalization factor. In some embodiments, the block decompression processing device may use bitwise arithmetic operations to adjust the values of the added padding bits. For unsigned compressed weight data, what bit values may be used for the padding bits may be preconfigured, based on a most significant bit of each compressed weight value, or based on a resource cost of the value of the padding bit. The decompression processing device adding the padding bits to the bits in the frame payload according to the normalization factor in block 1110 may be a processor or an AI processor.

In response to determining that the frame payload of the block of compressed weight data is signed (i.e., determination block 1108="No"), the decompression processing device may add padding bits to the bits in the frame payload according to a normalization factor and a sign bit in block 1120. The normalization factor may be used in a manner similar as described in block 1110. In some embodiments, the block decompression processing device may use bitwise arithmetic operations to adjust the values of the added padding bits. For signed compressed weight data, what bit values may be used for the padding bits may be based on a value of a sign bit of each signed compressed weight value.

In some embodiments, the padding bits may be sign extended bits. The decompression processing device adding the padding bits to the bits in the frame payload according to the normalization factor and the sign bit in block 1120 may be a processor or an AI processor.

Following adding the padding bits to the bits in the frame payload according to the normalization factor in block 1110 or adding the padding bits to the bits in the frame payload according to the normalization factor and the sign bit in block 1120, the decompression processing device may determine whether an offset indicator is set for the frame payload in optional determination block 1112. Whether an offset indicator is set for the frame payload may be determined from the output of parsing the associated frame header of the frame payload, and particularly parsing the offset indicator, in block 1106. The decompression processing device determining whether an offset indicator is set for the frame payload in optional determination block 1112 may be a processor or an AI processor.

In response to determining that an offset indicator is set for the frame payload (i.e., optional determination block 1112="Yes"), the decompression processing device may include an offset value for each decompressed weight value in the payload frame in optional block 1114. The offset value may be determined from the output of parsing the global header, and the offset, in block 1104. In some embodiments, the global header may include multiple offsets, and the offset indicator of the associated frame header may be configured to indicate to the decompression processing device which offset from the global header to use. The decompression processing device may include the offset value in each decompressed weight value in the payload frame. For example, the decompression processing device may add or subtract the offset value and each decompressed weight value in the payload frame. The decompression processing device including the offset value for each decompressed weight value in the payload frame in optional block 1114 may be a processor or an AI processor.

In determination block 1116, the decompression processing device may determine whether there is a remaining frame payload. The decompression processing device may determine whether there is a remaining frame payload from a list, table, array, queue, stack, etc. of frame payloads. The decompression processing device determining whether there is a remaining frame payload in determination block 1116 may be a processor or an AI processor. In some embodiments the decompression processing device may determine whether there is a remaining frame payload in determination block 1116 following adding the padding bits to the bits in the frame payload according to the normalization factor in block 1110 or adding the padding bits to the bits in the frame payload according to the normalization factor and the sign bit in block 1120. In some embodiments, the decompression processing device may determine whether there is a remaining frame payload in determination block 1116 in response to determining that an offset indicator is not set for the frame payload (i.e., optional determination block 1112="No"), or following including the offset value for each decompressed weight value in the payload frame in optional block 1114.

In response to determining that there is not a remaining frame (i.e., determination block 1008="No"), the decompression processing device may generate a block of decompressed weight data (e.g., block of decompressed weight data 720 in FIG. 7) in block 1118. The decompression processing device may output and store to a memory the decompressed weight values resulting from adding the padding bits in block 1110. In some embodiments, the decompression processing device may output and store to the memory the decompressed weight values resulting from adding the padding bits in optional block 1120. In some embodiments, the decompression processing device may output and store to the memory the decompressed weight values resulting from including the offset in the decompressed weight values in optional block 1114. The decompression processing device generating the block of decompressed weight data in block 1118 may be a processor or an AI processor.

In response to determining that there is not a remaining frame (i.e., determination block 1008="Yes"), the decompression processing device may parse a frame header of the block of compressed weight data in block 1106.

Figure 12:
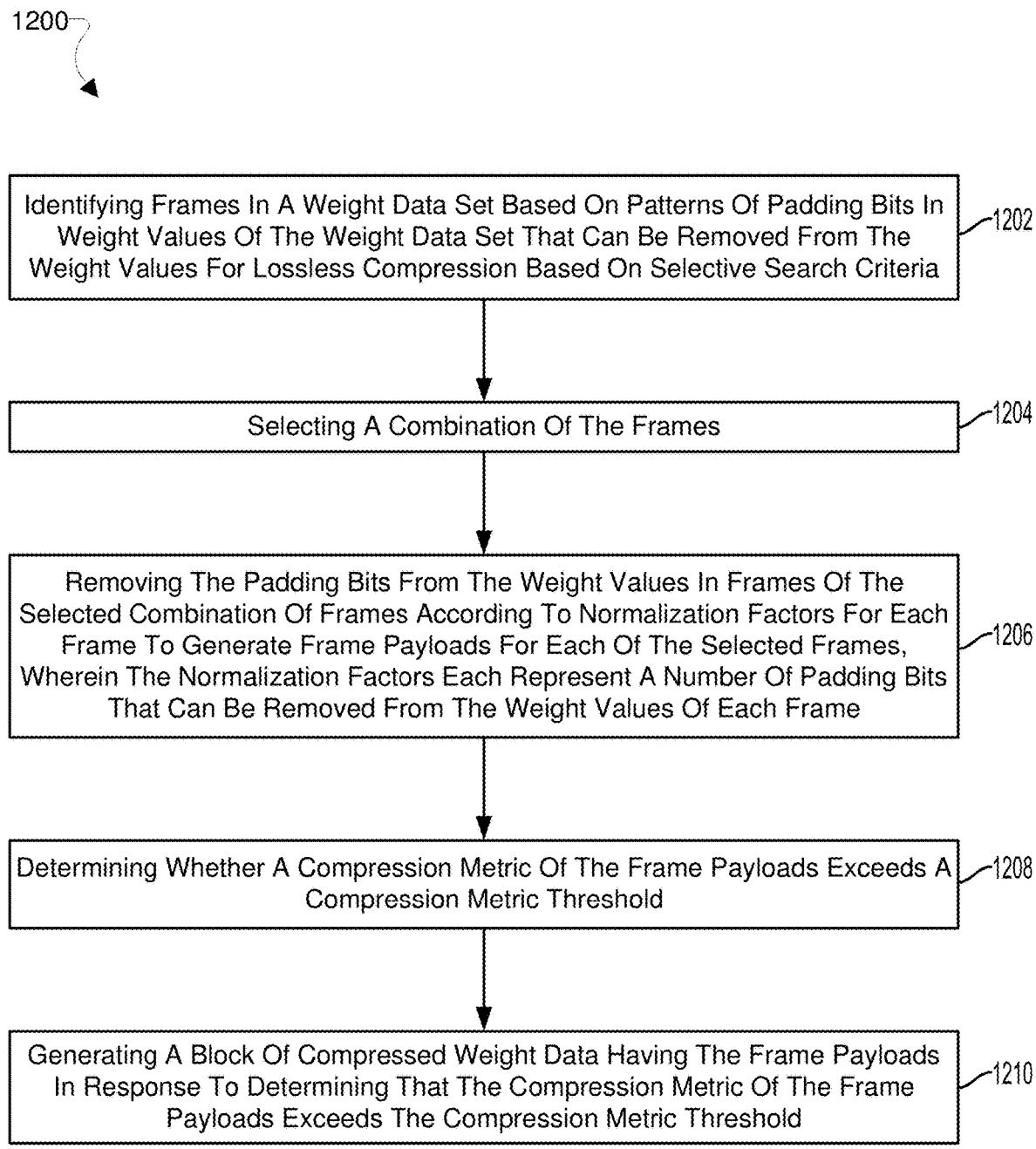
FIG. 12 is process flow diagram illustrating a method for compressing weight data according to an embodiment.

FIG. 12 illustrates a method 1200 for compressing weight data according to an embodiment. With reference to FIGS. 1-12, the method 1200 may be implemented in a computing device (e.g., computing device 100 in FIG. 1), in hardware, in software executing in a processor, or in a combination of a software-configured processor and dedicated hardware (e.g., processor 104, memory 106, 114, AI processor 124, in FIG. 1, processor 202, processor memory 204, AI processor 206, memory 208 in FIG. 2). In order to encompass the alternative configurations enabled in various embodiments, the hardware implementing the method 1200 is referred to herein as a "compression processing device."

In block 1202, the compression processing device may identify frames (e.g., frames 302a, 302b, 302c, 302d, 302e, 304a, 304b, 304c, 304d in FIGS. 3A and 3B) in a weight data set (e.g., weight data set 300 in FIGS. 3A and 3B) based on patterns of padding bits in weight values of the weight data set that may be removed from the weight values for lossless compression based on selective search criteria. Block 1202 may be implemented in a manner similar to the operations in block 804 of the method 800 as described with reference to FIG. 8.

In block 1204, the compression processing device may select a combination of the frames. Block 1204 may be implemented in a manner similar to the operations in block 806 of the method 800 as described with reference to FIG. 8.

In block 1206, the compression processing device may remove padding bits from the weight values in frames of the selected combination of frames according to normalization factors (e.g., normalization factor 604 in FIG. 6) for each frame to generate frame payloads (e.g., frame payloads 406a, 406b, 406c in FIG. 4, and frame payload 702a, 702b, 702c, 702d in FIG. 7) for each of the selected frames. The normalization factors may each represent a number of padding bits that may be removed from the weight values of each frame. Block 1206 may be implemented in a manner similar to the operations in block 808 of the method 800 as described with reference to FIG. 8, and/or block 1004 and/or optional block 1012 of the method 1000 as described with reference to FIG. 10.

In block 1208, the compression processing device may determine whether a compression metric of the frame payloads exceeds a compression metric threshold. Block 1208 may be implemented in a manner similar to the operations in determination block 812 of the method 800 as described with reference to FIG. 8.

In block 1210, the compression processing device may generate a block of compressed weight data (e.g., block of compressed weight data 400 in FIG. 4) having the frame payloads in response to determining that the compression metric of the frame payloads exceeds the compression metric threshold. Block 1210 may be implemented in a manner similar to the operations in block 1010 of the method 1000 as described with reference to FIG. 10.

Figure 13:
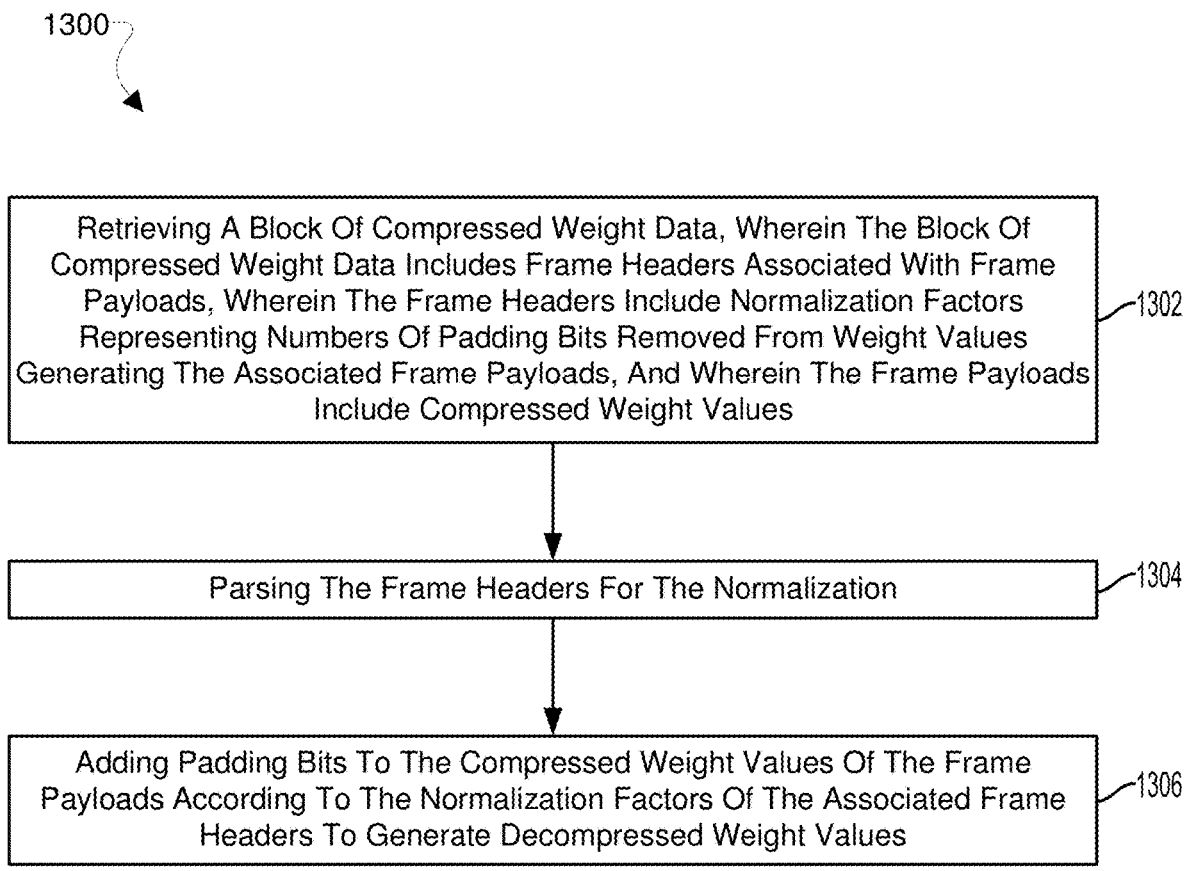
FIG. 13 is a process flow diagram illustrating a method for decompressing compressed weight data according to an embodiment.

FIG. 13 illustrates a method 1300 for decompressing weight data according to an embodiment. With reference to FIGS. 1-13, the method 1300 may be implemented in a computing device (e.g., computing device 100 in FIG. 1), in hardware, in software executing in a processor, or in a combination of a software-configured processor and dedicated hardware (e.g., processor 104, memory 106, 114, AI processor 124, in FIG. 1, processor 202, processor memory 204, AI processor 206, memory 208 in FIG. 2, decompressor 710, header parser 712, block denormalizer 714 in FIG. 7). In order to encompass the alternative configurations enabled in various embodiments, the hardware implementing the method 1300 is referred to herein as a "decompression processing device."

In block 1302, the decompression processing device may retrieve a block of compressed weight data (e.g., block of compressed weight data 400 in FIG. 4, block of compressed weight data 700 in FIG. 7). The block of compressed weight data may include frame headers (e.g., frame header 404a, 404b, 404c, 404d in FIG. 4, frame header 600 in FIG. 6, and frame header 706a, 706b, 706c, 706d, 706e in FIG. 7) associated with frame payloads (e.g., frame payloads 406a, 406b, 406c in FIG. 4, and frame payload 702a, 702b, 702c, 702d in FIG. 7). The frame headers may include normalization factors (e.g., normalization factor 604 in FIG. 6) representing numbers of padding bits removed from weight values generating the associated frame payloads. The frame payloads include compressed weight values. Block 1302 may be implemented in a manner similar to the operations in block 1102 of the method 1100 as described with reference to FIG. 11.

In block 1304, the decompression processing device may parse the frame headers for the normalization factors. Block 1304 may be implemented in a manner similar to the operations in block 1106 of the method 1100 as described with reference to FIG. 11.

In block 1306, the decompression processing device may add padding bits to the compressed weight values of the frame payloads according to the normalization factors of the associated frame headers to generate decompressed weight values. Block 1306 may be implemented in a manner similar to the operations in block 1110 and/or block 1120 of the method 1100 as described with reference to FIG. 11.

Figure 14:
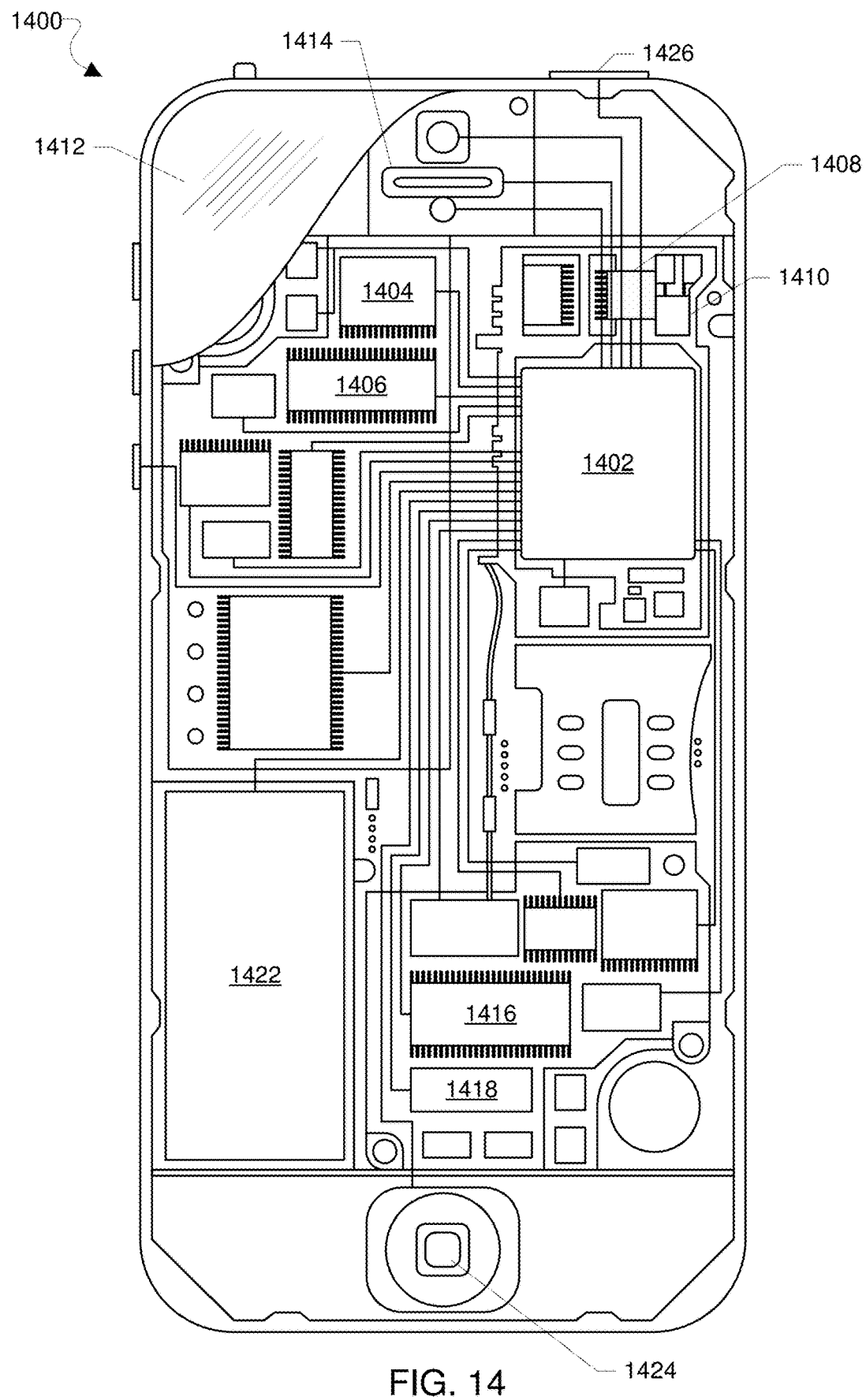
FIG. 14 is a component block diagram illustrating an example mobile computing device suitable for implementing a weight data compression and/or decompression system in accordance with the various embodiments.

A weight data compression and/or decompression system in accordance with the various embodiments (including, but not limited to, embodiments described above with reference to FIGS. 1-13) may be implemented in a wide variety of computing systems including mobile computing devices, an example of which suitable for use with the various embodiments is illustrated in FIG. 14. The mobile computing device 1400 may include a processor 1402 coupled to a touchscreen controller 1404 and an internal memory 1406. The processor 1402 may be one or more multicore integrated circuits designated for general or specific processing tasks. The internal memory 1406 may be volatile or non-volatile memory, and may also be secure and/or encrypted memory, or unsecure and/or unencrypted memory, or any combination thereof. Examples of memory types that can be leveraged include but are not limited to DDR, LPDDR, GDDR, WIDEIO, RAM, SRAM, DRAM. P-RAM, R-RAM, M-RAM, STT-RAM, and embedded DRAM. The touchscreen controller 1404 and the processor 1402 may also be coupled to a touchscreen panel 1412, such as a resistive-sensing touchscreen, capacitive-sensing touchscreen, infrared sensing touchscreen, etc. Additionally, the display of the mobile computing device 1400 need not have touch screen capability.

The mobile computing device 1400 may have one or more radio signal transceivers 1408 (e.g., Peanut, Bluetooth, ZigBee, Wi-Fi, RF radio) and antennae 1410, for sending and receiving communications, coupled to each other and/or to the processor 1402. The transceivers 1408 and antennae 1410 may be used with the above-mentioned circuitry to implement the various wireless transmission protocol stacks and interfaces. The mobile computing device 1400 may include a cellular network wireless modem chip 1416 that enables communication via a cellular network and is coupled to the processor.

The mobile computing device 1400 may include a peripheral device connection interface 1418 coupled to the processor 1402. The peripheral device connection interface 1418 may be singularly configured to accept one type of connection, or may be configured to accept various types of physical and communication connections, common or proprietary, such as Universal Serial Bus (USB), FireWire. Thunderbolt, or PCIe. The peripheral device connection interface 1418 may also be coupled to a similarly configured peripheral device connection port (not shown).

The mobile computing device 1400 may also include speakers 1414 for providing audio outputs. The mobile computing device 1400 may also include a housing 1424, constructed of a plastic, metal, or a combination of materials, for containing all or some of the components described herein. The mobile computing device 1400 may include a power source 1422 coupled to the processor 1402, such as a disposable or rechargeable battery. The rechargeable battery may also be coupled to the peripheral device connection port to receive a charging current from a source external to the mobile computing device 1400. The mobile computing device 1400 may also include a physical button 1424 for receiving user inputs. The mobile computing device 1400 may also include a power button 1426 for turning the mobile computing device 1400 on and off.

Figure 15:
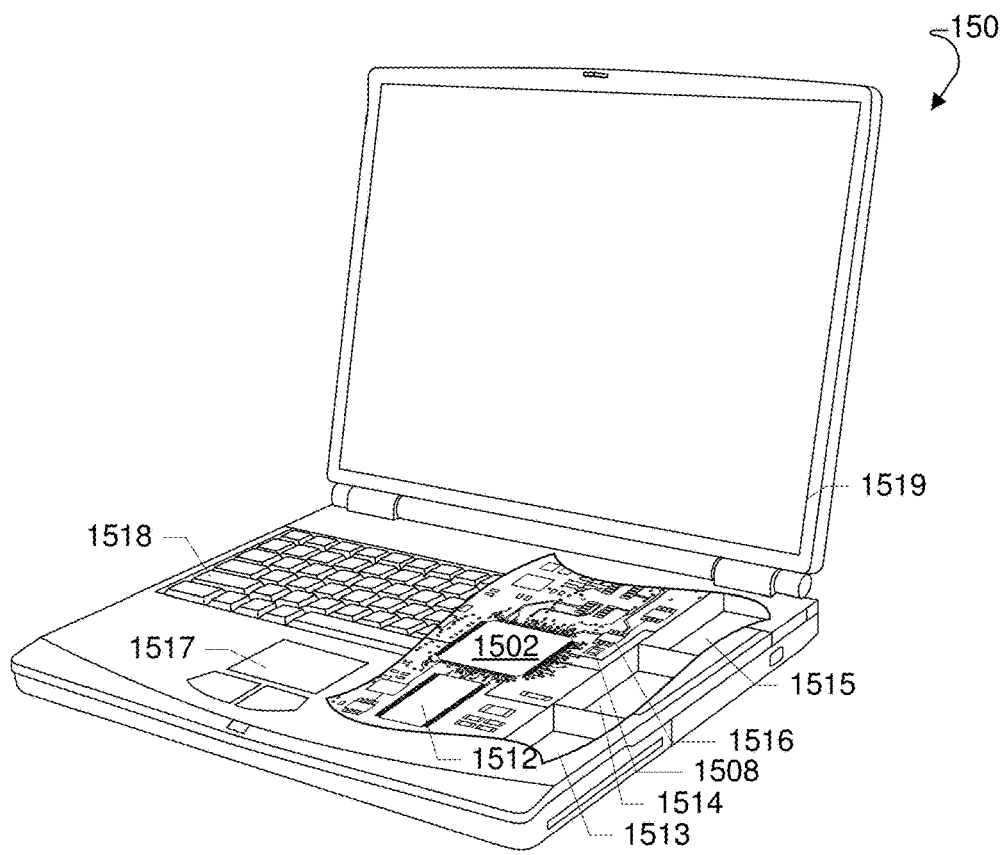
FIG. 15 is a component block diagram illustrating an example mobile computing device suitable for implementing a weight data compression and/or decompression system in accordance with the various embodiments.

A weight data compression and/or decompression system in accordance with the various embodiments (including, but not limited to, embodiments described above with reference to FIGS. 1-13) may be implemented in a wide variety of computing systems include a laptop computer 1500 an example of which is illustrated in FIG. 15. Many laptop computers include a touchpad touch surface 1517 that serves as the computer's pointing device, and thus may receive drag, scroll, and flick gestures similar to those implemented on computing devices equipped with a touch screen display and described above. A laptop computer 1500 will typically include a processor 1502 coupled to volatile memory 1512 and a large capacity nonvolatile memory, such as a disk drive 1513 of Flash memory. Additionally, the computer 1500 may have one or more antenna 1508 for sending and receiving electromagnetic radiation that may be connected to a wireless data link and/or cellular telephone transceiver 1516 coupled to the processor 1502. The computer 1500 may also include a floppy disc drive 1514 and a compact disc (CD) drive 1515 coupled to the processor 1502. In a notebook configuration, the computer housing includes the touchpad 1517, the keyboard 1518, and the display 1519 all coupled to the processor 1502. Other configurations of the computing device may include a computer mouse or trackball coupled to the processor (e.g., via a USB input) as are well known, which may also be used in conjunction with the various embodiments.

Figure 16:
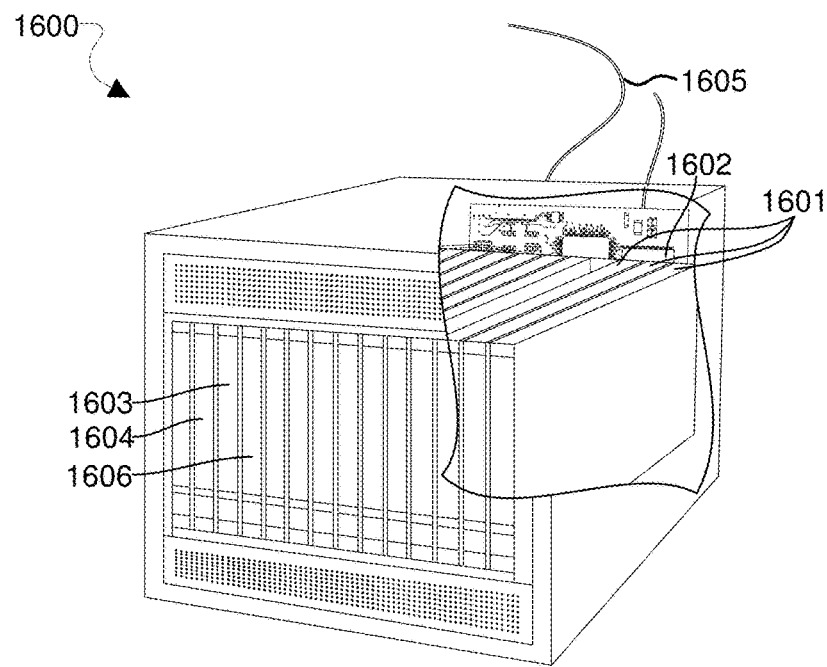
FIG. 16 is a component block diagram illustrating an example server suitable for implementing a weight data compression and/or decompression system in accordance with the various embodiments.

A weight data compression and/or decompression system in accordance with the various embodiments (including, but not limited to, embodiments described above with reference to FIGS. 1-13) may also be implemented in fixed computing systems, such as any of a variety of commercially available servers. An example server 1600 is illustrated in FIG. 16. Such a server 1600 typically includes one or more multicore processor assemblies 1601 coupled to volatile memory 1602 and a large capacity nonvolatile memory, such as a disk drive 1604. As illustrated in FIG. 16, multicore processor assemblies 1601 may be added to the server 1600 by inserting them into the racks of the assembly. The server 1600 may also include a floppy disc drive, compact disc (CD) or digital versatile disc (DVD) disc drive 1606 coupled to the processor 1601. The server 1600 may also include network access ports 1603 coupled to the multicore processor assemblies 1601 for establishing network interface connections with a network 1605, such as a local area network coupled to other broadcast system computers and servers, the Internet, the public switched telephone network, and/or a cellular data network (e.g., CDMA, TDMA, GSM, PCS, 3G, 4G, LTE, 5G or any other type of cellular data network).

Implementation examples are described in the following paragraphs. While some of the following implementation examples are described in terms of example methods, further example implementations may include: the example methods discussed in the following paragraphs implemented by a computing device including a compression processing device configured to perform operations of the example methods; the example methods discussed in the following paragraphs implemented by a computing device including a decompression processing device configured to perform operations of the example methods; the example methods discussed in the following paragraphs implemented by a computing device including means for performing functions of the example methods; and the example methods discussed in the following paragraphs implemented as a non-transitory processor-readable storage medium having stored thereon processor-executable instructions configured to cause a processor of a computing device to perform the operations of the example methods.

Example 1. A method performed in a processor of a computing device, including receiving a weight data set of binary numbers representing weight values, generating a first frame payload including a compressed first frame of a first subset of the weight values in the weight data set, generating a first frame header associated with the first frame payload, in which the first frame header includes a normalization factor indicator for the compressed first frame, and generating a block of compressed weight data having the first frame payload.

Example 2. The method of example 1, in which generating the first frame payload includes compressing a first frame of the first subset of the weight values in the weight data set by removing padding bits from each weight value of the first subset of the weight values according to a normalization factor for the first frame to generate the compressed first frame.

Example 3. The method of example 2, further including removing an offset value from each weight value of the first subset of the weight values of the first frame producing modified weight values of the first frame, in which compressing the first frame of the first subset of the weight values includes removing the padding bits from the modified weight values in the first frame according to the normalization factor for the first frame to generate the compressed first frame.

Example 4. The method of example 3, further including generating a global header for the block of compressed weight data, in which the global header includes the offset value, and in which generating the first frame header associated with the first frame payload includes generating the first frame header, in which the first frame header includes an offset indicator configured to indicate whether the offset value is removed from the first subset of the weight values of the first frame.

Example 5. The method of example 2-4, in which the padding bits are sign extended bits.

Example 6. The method of any of examples 1-5, further including identifying a first frame of the first subset of the weight values in the weight data set based on patterns of padding bits in the weight values that can be removed from the weight values for lossless compression based on selective search criteria, setting a first normalization factor for the first frame representing a number of padding bits to be removed from each weight value of the first subset of the weight values, identifying a second frame of a second subset of the weight values in the weight data set based on patterns of padding bits in the weight values that can be removed from the weight values for lossless compression based on selective search criteria, determining whether all bits of the second frame are zero value, and in response to determining that all of the bits of the second frame are zero value: setting a second normalization factor for the second frame to represent all of the bits of the second subset of the weight values of the second frame, compressing the second frame of the second subset of the weight values by removing all of the bits from the second subset of the weight values according to the second normalization factor for the second frame, and generating a second frame header that is unassociated with a frame payload.

Example 7. The method of any of examples 1-6, further including identifying a first frame of the first subset of the weight values in the weight data set based on patterns of padding bits in the weight values that can be removed from the weight values for lossless compression based on selective search criteria, identifying a weight value of the first subset of the weight values of the first frame having a highest number of significant bits, and setting the normalization factor for the first frame representing a number of padding bits to be removed from each weight value of the first subset of the weight values based on the highest number of significant bits.

Example 8. The method of any of examples 1-7, further including determining whether a first compression metric of the first frame payload exceeds a compression metric threshold, in which generating the block of compressed weight data having the first frame payload includes generating the block of compressed weight data having the first frame payload in response to determining that the first compression metric of the first frame payload exceeds the compression metric threshold.

Example 9. The method of example 8, further including setting the compression metric threshold to the first compression metric of the first frame payload, generating a second frame payload including a compressed second frame of a second subset of the weight values in the weight data set, determining whether a second compression metric of the second frame payload exceeds the compression metric threshold, setting the compression metric threshold to the second compression metric of the second frame payload in response to determining that the second compression metric exceeds the compression metric threshold, generating a third frame payload including a compressed third frame of a third subset of the weight values in the weight data set, and determining whether a third compression metric of the third frame payload exceeds the compression metric threshold, in which generating the block of compressed weight data having the first frame payload in response to determining that the first compression metric of the first frame payload exceeds the compression metric threshold includes generating the block of compressed weight data having the second frame payload in response to determining that the third compression metric of the third frame payload does not exceed the compression metric threshold.

Example 10. A method performed in a processor of a computing device, including retrieving a block of compressed weight data, in which the block of compressed weight data includes a first frame header associated with a first frame payload, in which the first frame header includes a first normalization factor indicator, and in which the first frame payload includes compressed weight values: and generating a first decompressed frame includes decompressed weight values of the compressed weight values of the first frame payload.

Example 11. The method of example 10, in which the block of compressed weight data includes a global header having an offset value, and the first frame header includes an offset indicator configured to indicate whether the offset value is to be included for each decompressed weight value generated from the first frame payload, the method further including parsing the global header for the offset value, parsing the first frame header for the offset indicator, and determining whether the offset indicator is set in the first frame header, in which generating the first decompressed frame includes including the offset value in each decompressed weight value generated from the first frame payload associated with the first frame header in response to determining that the offset indicator is set in the first frame header.

Example 12. The method of any of examples 10 or 11, in which the block of compressed weight data includes a second frame header unassociated with a frame payload including a second normalization factor indicator, the method further including generating a second decompressed frame including decompressed weight values having all zero value bits according to the second normalization factor indicator of the second frame header.

Example 13. The method of any of examples 10-12, in which the block of compressed weight data includes a second frame header associated with a second frame payload, in which the second frame header includes a second normalization factor indicator, and in which the second frame payload includes compressed weight values, the method further including generating a second decompressed frame including decompressed weight values of the compressed weight values of the second frame payload by adding padding bits to the compressed weight values of the second frame payload according to the second normalization factor indicator of the second frame header.

Example 14. The method of any of examples 10-13, in which generating the first decompressed frame includes adding padding bits to the compressed weight values of the first frame payload according to the first normalization factor indicator of the first frame header to generate decompressed weight values, and in which a value of the padding bits for a first compressed weight value of the compressed weight values of the first frame payload is determined from a most significant bit of the first compressed weight value.

Example 15. The method of any of examples 13 or 14, in which the padding bits are sign extended bits.

Example 16. The method of any of examples 10-15, in which the first frame header includes a frame length configured to indicate a number of the compressed weight values of the first frame payload.

Example 17. The method of any of examples 10-16, in which the block of compressed weight data includes a second frame header unassociated with a frame payload including a frame length configured to indicate a second decompressed frame including a number of the compressed weight values, the method further including generating a number consecutive decompressed weight values having all zero value bits corresponding to the frame length of the second frame header.

Computer program code or "program code" for execution on a programmable processor for carrying out operations of the various embodiments may be written in a high level programming language such as C, C++, C#, Smalltalk, Java, JavaScript, Visual Basic, a Structured Query Language (e.g., Transact-SQL), Perl, or in various other programming languages. Program code or programs stored on a computer readable storage medium as used in this application may refer to machine language code (such as object code) whose format is understandable by a processor.

The foregoing method descriptions and the process flow diagrams are provided merely as illustrative examples and are not intended to require or imply that the operations of the various embodiments must be performed in the order presented. As will be appreciated by one of skill in the art the order of operations in the foregoing embodiments may be performed in any order. Words such as "thereafter," "then," "next," etc. are not intended to limit the order of the operations; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm operations described in connection with the various embodiments may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

The hardware used to implement the various illustrative logics, logical blocks, modules, and circuits described in connection with the embodiments disclosed herein may be implemented or performed with a general purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable medium or a non-transitory processor-readable medium. The operations of a method or algorithm disclosed herein may be embodied in a processor-executable software module that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory. CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments and implementations without departing from the scope of the claims. Thus, the present disclosure is not intended to be limited to the embodiments and implementations described herein, but is to be accorded the widest scope consistent with the following claims and the principles and novel features disclosed herein.

What is claimed is:

1. A method performed in a processor of a computing device, comprising:
   receiving a weight data set of binary numbers representing weight values;
   generating a first frame payload comprising a compressed first frame of a first subset of the weight values in the weight data set;
   generating a first frame header associated with the first frame payload, wherein the first frame header includes a normalization factor indicator for the compressed first frame; and
   generating a block of compressed weight data having the first frame payload.

2. The method of claim 1, wherein generating the first frame payload comprises compressing a first frame of the first subset of the weight values in the weight data set by removing padding bits from each weight value of the first subset of the weight values according to a normalization factor for the first frame to generate the compressed first frame.

3. The method of claim 2, further comprising removing an offset value from each weight value of the first subset of the weight values of the first frame producing modified weight values of the first frame,
wherein compressing the first frame of the first subset of the weight values comprises removing the padding bits from the modified weight values in the first frame according to the normalization factor for the first frame to generate the compressed first frame.

4. The method of claim 3, further comprising generating a global header for the block of compressed weight data, wherein the global header includes the offset value, and
wherein generating the first frame header associated with the first frame payload comprises generating the first frame header, wherein the first frame header includes an offset indicator configured to indicate whether the offset value is removed from the first subset of the weight values of the first frame.

5. The method of claim 2, wherein the padding bits are sign extended bits.

6. The method of claim 1, further comprising:
identifying a first frame of the first subset of the weight values in the weight data set based on patterns of padding bits in the weight values that can be removed from the weight values for lossless compression based on selective search criteria;
setting a first normalization factor for the first frame representing a number of padding bits to be removed from each weight value of the first subset of the weight values;
identifying a second frame of a second subset of the weight values in the weight data set based on patterns of padding bits in the weight values that can be removed from the weight values for lossless compression based on selective search criteria;
determining whether all bits of the second frame are zero value; and
in response to determining that all of the bits of the second frame are zero value:
setting a second normalization factor for the second frame to represent all of the bits of the second subset of the weight values of the second frame;
compressing the second frame of the second subset of the weight values by removing all of the bits from the second subset of the weight values according to the second normalization factor for the second frame; and
generating a second frame header that is unassociated with a frame payload.

7. The method of claim 1, further comprising:
identifying a first frame of the first subset of the weight values in the weight data set based on patterns of padding bits in the weight values that can be removed from the weight values for lossless compression based on selective search criteria;
identifying a weight value of the first subset of the weight values of the first frame having a highest number of significant bits; and
setting a normalization factor for the first frame representing a number of padding bits to be removed from each weight value of the first subset of the weight values based on the highest number of significant bits.

8. The method of claim 1, further comprising determining whether a first compression metric of the first frame payload exceeds a compression metric threshold, wherein generating the block of compressed weight data having the first frame payload comprises generating the block of compressed weight data having the first frame payload in response to determining that the first compression metric of the first frame payload exceeds the compression metric threshold.

9. The method of claim 8, further comprising:
setting the compression metric threshold to the first compression metric of the first frame payload;
generating a second frame payload comprising a compressed second frame of a second subset of the weight values in the weight data set;
determining whether a second compression metric of the second frame payload exceeds the compression metric threshold;
setting the compression metric threshold to the second compression metric of the second frame payload in response to determining that the second compression metric exceeds the compression metric threshold;
generating a third frame payload comprising a compressed third frame of a third subset of the weight values in the weight data set; and
determining whether a third compression metric of the third frame payload exceeds the compression metric threshold,
wherein generating the block of compressed weight data having the first frame payload in response to determining that the first compression metric of the first frame payload exceeds the compression metric threshold comprises generating the block of compressed weight data having the second frame payload in response to determining that the third compression metric of the third frame payload does not exceed the compression metric threshold.

10. A computing device, comprising:
a compression processing device configured to perform operations comprising:
receiving a weight data set of binary numbers representing weight values;
generating a first frame payload comprising a compressed first frame of a first subset of the weight values in the weight data set;
generating a first frame header associated with the first frame payload, wherein the first frame header includes a normalization factor indicator for the compressed first frame; and
generating a block of compressed weight data having the first frame payload.

11. The computing device of claim 10, wherein the compression processing device configured is further configured such that generating the first frame payload comprises compressing a first frame of the first subset of the weight values in the weight data set by removing padding bits from each weight value of the first subset of the weight values according to a normalization factor for the first frame to generate the compressed first frame.

12. The computing device of claim 11, wherein the compression processing device is configured to perform operations further comprising removing an offset value from each weight value of the first subset of the weight values of the first frame producing modified weight values of the first frame,
wherein the compression processing device is configured to perform operations such that compressing the first frame of the first subset of the weight values comprises removing the padding bits from the modified weight values in the first frame according to the normalization factor for the first frame to generate the compressed first frame.

13. The computing device of claim 12, wherein the compression processing device is configured to perform operations further comprising generating a global header for the block of compressed weight data, wherein the global header includes the offset value, and wherein the compression processing device is configured to perform operations such that generating the first frame header associated with the first frame payload comprises generating the first frame header, wherein the first frame header includes an offset indicator configured to indicate whether the offset value is removed from the first subset of the weight values of the first frame.

14. The computing device of claim 11, wherein the compression processing device is configured to perform operations such that the padding bits are sign extended bits.

15. The computing device of claim 10, wherein the compression processing device is configured to perform operations further comprising:

identifying a first frame of the first subset of the weight values in the weight data set based on patterns of padding bits in the weight values that can be removed from the weight values for lossless compression based on selective search criteria;

setting a first normalization factor for the first frame representing a number of padding bits to be removed from each weight value of the first subset of the weight values;

identifying a second frame of a second subset of the weight values in the weight data set based on patterns of padding bits in the weight values that can be removed from the weight values for lossless compression based on selective search criteria;

determining whether all bits of the second frame are zero value; and in response to determining that all of the bits of the second frame are zero value:

setting a second normalization factor for the second frame to represent all of the bits of the second subset of the weight values of the second frame;

compressing the second frame of the second subset of the weight values by removing all of the bits from the second subset of the weight values according to the second normalization factor for the second frame; and generating a second frame header that is unassociated with a frame payload.

16. The computing device of claim 10, wherein the compression processing device is configured to perform operations further comprising:

identifying a first frame of the first subset of the weight values in the weight data set based on patterns of padding bits in the weight values that can be removed from the weight values for lossless compression based on selective search criteria;

identifying a weight value of the first subset of the weight values of the first frame having a highest number of significant bits; and setting a normalization factor for the first frame representing a number of padding bits to be removed from each weight value of the first subset of the weight values based on the highest number of significant bits.

17. The computing device of claim 10, wherein the compression processing device is configured to perform operations further comprising determining whether a first compression metric of the first frame payload exceeds a compression metric threshold, wherein the compression processing device is configured to perform operations such that generating the block of compressed weight data having the first frame payload comprises generating the block of compressed weight data having the first frame payload in response to determining that the first compression metric of the first frame payload exceeds the compression metric threshold.

18. The computing device of claim 17, wherein the compression processing device is configured to perform operations further comprising:

setting the compression metric threshold to the first compression metric of the first frame payload;

generating a second frame payload comprising a compressed second frame of a second subset of the weight values in the weight data set;

determining whether a second compression metric of the second frame payload exceeds the compression metric threshold;

setting the compression metric threshold to the second compression metric of the second frame payload in response to determining that the second compression metric exceeds the compression metric threshold;

generating a third frame payload comprising a compressed third frame of a third subset of the weight values in the weight data set; and determining whether a third compression metric of the third frame payload exceeds the compression metric threshold, wherein the compression processing device is configured to perform operations such that generating the block of compressed weight data having the first frame payload in response to determining that the first compression metric of the first frame payload exceeds the compression metric threshold comprises generating the block of compressed weight data having the second frame payload in response to determining that the third compression metric of the third frame payload does not exceed the compression metric threshold.

19. A method performed in a processor of a computing device, comprising:

retrieving a block of compressed weight data, wherein the block of compressed weight data includes a first frame header associated with a first frame payload, wherein the first frame header includes a first normalization factor indicator, and wherein the first frame payload includes compressed weight values; and generating a first decompressed frame comprising decompressed weight values of the compressed weight values of the first frame payload.

20. The method of claim 19, wherein:

the block of compressed weight data includes a global header having an offset value, and the first frame header includes an offset indicator configured to indicate whether the offset value is to be included for each decompressed weight value generated from the first frame payload, the method further comprising:

parsing the global header for the offset value;

parsing the first frame header for the offset indicator; and determining whether the offset indicator is set in the first frame header, wherein generating the first decompressed frame comprises including the offset value in each decompressed weight value generated from the first frame payload associated with the first frame header in response to determining that the offset indicator is set in the first frame header.

21. The method of claim 19, wherein the block of compressed weight data includes a second frame header unassociated with a frame payload including a second normalization factor indicator, the method further comprising:
generating a second decompressed frame comprising decompressed weight values having all zero value bits according to the second normalization factor indicator of the second frame header.

22. The method of claim 19, wherein the block of compressed weight data includes a second frame header associated with a second frame payload, wherein the second frame header includes a second normalization factor indicator, and wherein the second frame payload includes compressed weight values, the method further comprising generating a second decompressed frame comprising decompressed weight values of the compressed weight values of the second frame payload by adding padding bits to the compressed weight values of the second frame payload according to the second normalization factor indicator of the second frame header.

23. The method of claim 19, wherein generating the first decompressed frame comprises adding padding bits to the compressed weight values of the first frame payload according to the first normalization factor indicator of the first frame header to generate decompressed weight values, wherein a value of the padding bits for a first compressed weight value of the compressed weight values of the first frame payload is determined from a most significant bit of the first compressed weight value.

24. The method of claim 23, wherein the padding bits are sign extended bits.

25. The method of claim 19, wherein the first frame header includes a frame length configured to indicate a number of the compressed weight values of the first frame payload.

26. The method of claim 19, wherein the block of compressed weight data includes a second frame header unassociated with a frame payload including a frame length configured to indicate a number of the compressed weight values,
the method further comprising generating a second decompressed frame comprising a number consecutive decompressed weight values having all zero value bits corresponding to the frame length of the second frame header.

27. A computing device, comprising:
a decompression processing device configured to perform operations comprising:
retrieving a block of compressed weight data, wherein the block of compressed weight data includes a first frame header associated with a first frame payload, wherein the first frame header includes a first normalization factor indicator, and wherein the first frame payload includes compressed weight values; and
generating a first decompressed frame comprising decompressed weight values of the compressed weight values of the first frame payload.

28. The computing device of claim 27, wherein:
the block of compressed weight data includes a global header having an offset value;
the first frame header includes an offset indicator configured to indicate whether the offset value is to be included for each decompressed weight value generated from the first frame payload; and
the decompression processing device is configured to perform operations further comprising:
parsing the global header for the offset value;
parsing the first frame header for the offset indicator; and
determining whether the offset indicator is set in the first frame header,
wherein the compression processing device is configured to perform operations such that generating the first decompressed frame comprises including the offset value in each decompressed weight value generated from the first frame payload associated with the first frame header in response to determining that the offset indicator is set in the first frame header.

29. The computing device of claim 27, wherein the block of compressed weight data includes a second frame header unassociated with a frame payload including a second normalization factor indicator, and wherein the decompression processing device is configured to perform operations further comprising generating a second decompressed frame comprising decompressed weight values having all zero value bits according to the second normalization factor indicator of the second frame header.

30. The computing device of claim 27, wherein the decompression processing device is configured to perform operations such that generating the first decompressed frame comprises adding padding bits to the compressed weight values of the first frame payload according to the first normalization factor indicator of the first frame header to generate decompressed weight values, wherein the padding bits are sign extended bits.

* * * * *